US012599043B2

(12) United States Patent
Chang

(10) Patent No.: US 12,599,043 B2
(45) Date of Patent: Apr. 7, 2026

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Wei-Hao Chang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 483 days.

(21) Appl. No.: 18/119,784

(22) Filed: Mar. 9, 2023

(65) Prior Publication Data

US 2024/0304606 A1     Sep. 12, 2024

(51) Int. Cl.
H01L 23/552 (2006.01)
H01L 25/00 (2006.01)
H01L 25/10 (2006.01)

(52) U.S. Cl.
CPC .......... H01L 25/105 (2013.01); H01L 23/552 (2013.01); H01L 25/50 (2013.01); *H01L 2225/1041* (2013.01); *H01L 2225/1094* (2013.01)

(58) Field of Classification Search
CPC ...... H01L 25/105; H01L 23/552; H01L 25/50
See application file for complete search history.

(56) References Cited

U.S. PATENT DOCUMENTS

| | | | |
|---|---|---|---|
| 8,143,100 B2 | 3/2012 | Karnezos | |
| 8,564,125 B2 | 10/2013 | Cho et al. | |
| 2013/0056864 A1* | 3/2013 | Cho | ................. H01L 23/49833 257/713 |
| 2021/0257311 A1* | 8/2021 | Hsieh | ................. H01L 23/5385 |
| 2022/0344234 A1 | 10/2022 | Yeh | |

* cited by examiner

*Primary Examiner* — Errol V Fernandes
(74) *Attorney, Agent, or Firm* — Foley & Lardner LLP

(57) ABSTRACT

A semiconductor device package and a method of manufacturing the same are provided. The semiconductor device package includes a first circuit layer, a second circuit layer under the first circuit layer, a first electronic component between the first circuit layer and the second circuit layer and connected to the first circuit layer and a sub-package between the first circuit layer and the second circuit layer and connected to the second circuit layer. The sub package comprises a second electronic component under the first electronic component and a conductive structure configured to dissipate heat generated from the first electronic component.

9 Claims, 33 Drawing Sheets

SEMICONDUCTOR DEVICE PACKAGE AND METHOD OF MANUFACTURING THE SAME

BACKGROUND

1. Field of the Disclosure

The instant disclosure relates to, amongst other things, a semiconductor device package and method of manufacturing the same, and a semiconductor device package having a conductive structure.

2. Description of Related Art

In a three-dimensional (3D) stacked semiconductor device package, it is difficult to dissipate heat generated from a die mounted to the upper substrate and between the upper substrate and the lower substrate.

The heat generated from the die mounted to the upper substrate and between the upper substrate and the lower substrate should flow through the upper substrate and towards the interposer, and then flow to the lower substrate and the main board. Thus, the heat dissipation path will start from the die, pass through the upper substrate, interposer and the lower substrate and then reach the main board. Such long heat dissipation path will lead to heat accumulation, which may cause the die failure.

SUMMARY

According to one example embodiment of the instant disclosure, an electronic device includes a first circuit layer, a second circuit layer under the first circuit layer, a first electronic component between the first circuit layer and the second circuit layer and connected to the first circuit layer and a sub-package between the first circuit layer and the second circuit layer and connected to the second circuit layer. The sub package comprises a second electronic component under the first electronic component and a conductive structure configured to dissipate heat generated from the first electronic component.

According to another example embodiment of the instant disclosure, an electronic device includes a first circuit layer, a second circuit layer under the first circuit layer, a first electronic component between the first circuit layer and the second circuit layer and connected to the first circuit layer, a second electronic component between the first circuit layer and the second circuit layer and connected to the second circuit layer, a third electronic component between the first circuit layer and the second circuit layer and connected to the second circuit layer and a conductive structure configured to transfer heat generated from the first electronic component to the second circuit layer and to provide electromagnetic shielding between the second electronic component and the third electronic component.

According to another example embodiment of the instant disclosure, an electronic device includes a first circuit layer, a second circuit layer over the first circuit layer, a first electronic component connected to the first circuit layer, a second electronic component connected to the second circuit layer and a conductive structure connected to the first circuit layer. The first electronic component and the second electronic component are attached to the conductive structure. Further, an entirety of the conductive structure is arranged under the second circuit layer.

In order to further understanding of the instant disclosure, the following embodiments are provided along with illustrations to facilitate appreciation of the instant disclosure; however, the appended drawings are merely provided for reference and illustration, and do not limit the scope of the instant disclosure.

DETAILED DESCRIPTION

Figure 1A:
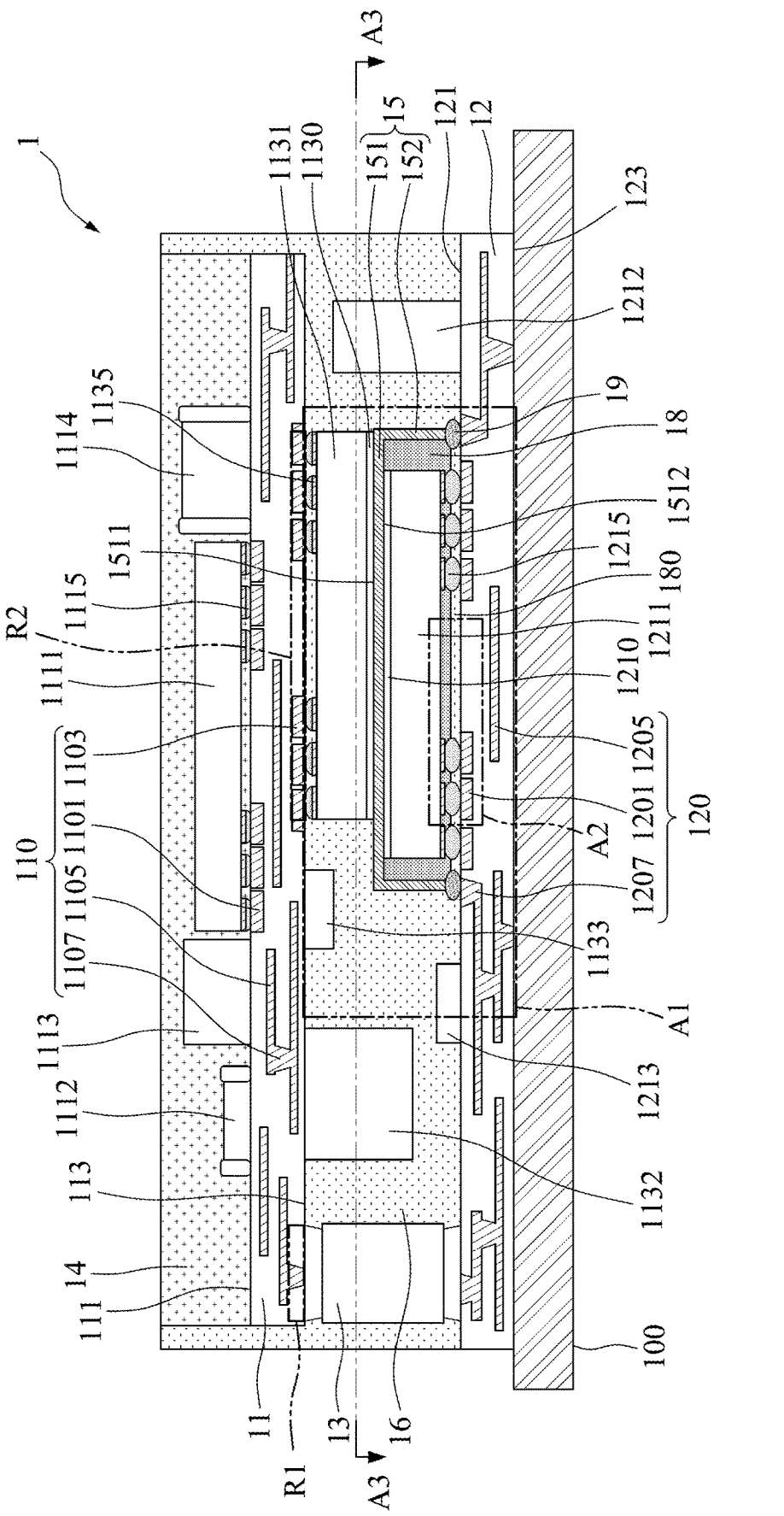
FIG. 1A is a cross-sectional view of a semiconductor device package in accordance with an embodiment of the instant disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Present disclosure provides a semiconductor device package with a conductive structure. The conductive structure may be disposed on an upper surface of a lower circuit layer and connected to an electronic component mounted on a lower surface of an upper substrate. The conductive structure is configured to transfer heat from the electronic component to the lower substrate trough itself. Therefore, the heat dissipation path for the electronic component could be shorten and the heat accumulation of the electronic component could be avoided.

Moreover, the conductive structure may be disposed on the upper surface of the lower circuit layer and support the electronic component from a bottom of the electronic component. That is, the conductive structure is configured to support the upper substrate and electronic components mounted to the upper substrate. Thus, the warpage of the upper substrate could be reduced.

Further, the conductive structure is configured to provide electromagnetic shielding between an electronic component covered by the conductive structure and an electronic component outside the conductive structure.

In addition, the conductive structure and an electronic component, which will be mounted to the lower circuit layer, could be formed a sub-package structure before stacking on the lower circuit layer. Such sub-package structure may improve the stability while building the three-dimensional (3D) stacked semiconductor device package.

FIG. 1A is a cross-sectional view of a semiconductor device package 1 in accordance with some embodiments of the present disclosure. As shown in FIG. 1A, the semiconductor device package 1 may be a three-dimensional (3D) stacked semiconductor device package. The semiconductor device 1 may include circuit layers 11, 12, an interposer 13, a conductive structure 15, encapsulants 14, 16, 18 and electronic components 1111, 1112, 1113, 1114, 1131, 1132, 1133, 1211, 1212, 1213. In some embodiments of the present disclosure, the semiconductor device package 1 may be disposed mounted on a main board 100. In some embodiments of the present disclosure, the semiconductor device package 1 may be electrically connected to an interconnection of the main board 100. In some embodiments of the present disclosure, the semiconductor device package 1 may be connected to the main board 100 via solder materials.

Referring to FIG. 1A, the circuit layer 11 may have a surface 111 (e.g., an upper surface) and a surface 113 (e.g., a lower surface). The circuit layer 11 may include an interconnection 110. In some embodiments of the present disclosure, the interconnection 110 includes one or more pads 1101, 1103, one or more redistribution layers 1105 and one or more through conductive vias 1107. Some portions of the interconnection 110 may be exposed from the surfaces 111 and 113 of the circuit layer 11. For example, the pads 1101 may be exposed form the surface 111 of the circuit layer 11, and the pads 1103 may be exposed from the surface 113 of the circuit layer 11.

The electronic components 1111, 1112, 1113 and 1114 may be disposed or mounted on the surface 111 of the circuit layer 11. The electronic component 1111, 1112, 1113, 1114 may be a die, an active device, a passive device, and/or other electronic devices. In some embodiments of the present disclosure, the electronic components 1111, 1112, 1113 and 1114 electrically connect the interconnection 110 of the circuit layer 11 via electrical connections. For example, the electronic component 1111 is electrically connected to the pads 1101 of the interconnection 110 of the circuit layer 11 via electrical connections 1115. In some embodiments of the present disclosure, the electrical connection 1115 includes a reflowable material. In some embodiments of the present disclosure, the electrical connection 1115 includes solder material. The electrical connection 1115 may include a solder ball. Further, the electronic components 1131, 1132 and 1133 may be disposed or mounted on the surface 113 of the circuit layer 11. The electronic component 1131, 1132, 1133 may be a die, an active device, a passive device, and/or other electronic devices. In some embodiments of the present disclosure, the electronic components 1131, 1132 and 1133 electrically connect the interconnection 110 of the circuit layer 11 via electrical connections. For example, the electronic component 1131 is electrically connected to the pads 1103 of the interconnection 110 of the circuit layer 11 via electrical connections 1135. In some embodiments of the present disclosure, the electrical connection 1135 includes a reflowable material. In some embodiments of the present disclosure, the electrical connection 1135 includes solder material. The electrical connection 1135 may include a solder ball.

The circuit layer 12 may be arranged under the circuit layer 11. The circuit layer 12 may have a surface 121 (e.g., an upper surface) and a surface 123 (e.g., a lower surface). The circuit layer 12 may include an interconnection 120. In some embodiments of the present disclosure, the interconnection 120 includes one or more pads 1201, one or more redistribution layers 1205 and one or more through conductive vias 1207. Some portions of the interconnection 120 may be exposed from the surfaces 121 and 123 of the circuit layer 12. For example, the pads 1201 may be exposed form the surface 121 of the circuit layer 12.

The electronic components 1211, 1212 and 1213 may be disposed or mounted on the surface 121 of the circuit layer 12. The electronic component 1211, 1212, 1213 may be a die, an active device, a passive device, and/or other electronic devices. In some embodiments of the present disclosure, the electronic components 1211, 1212 and 1213 electrically connect the interconnection 120 of the circuit layer 12 via electrical connections. For example, the electronic component 1211 is electrically connected to the pads 1201 of the interconnection 120 of the circuit layer 12 via electrical connections 1215. In some embodiments of the present disclosure, the electrical connection 1215 includes a reflowable material. In some embodiments of the present disclosure, the electrical connection 1215 includes solder material. The electrical connection 1215 may include a solder ball.

The interposers 13 may be disposed or mounted on the surface 121 of the circuit layer 12 and the surface 113 of the circuit layer 11. That is, the interposer 13 may be arranged between the circuit layer 11 and the circuit layer 12. Thus, the interposer 13 is configured to support the circuit layer 11 such that the circuit layer 11 is disposed above or over the circuit layer 12. Moreover, the interposer 13 may have an interconnection and electrically connect the interconnection 110 of the circuit layer 11 via electrical connections and electrically connect the interconnection 120 of the circuit layer 12 via electrical connections. Thus, the interposer 13 is configured to transfer a signal from the circuit layer 11 and/or the electronic components 1111, 1112, 1113, 1114, 1131, 1132 and/or 1133 mounted on the circuit layer 11 to the circuit layer 12 and/or the electronic components 1211, 1212 and/or 1213 mounted on the circuit layer 12 and/or to transfer a signal from the circuit layer 12 and/or the electronic components 1211, 1212 and/or 1213 mounted on the circuit layer 12 to the circuit layer 11 and/or the electronic components 1111, 1112, 1113, 1114, 1131, 1132 and/or 1133 mounted on the circuit layer 11. In some embodiments of the present disclosure, the interposer 13 includes a substrate.

The electronic components 1111 may electrically connect the electronic component 1211 through the circuit layer 11 and the interposer 13. The electronic components 1131 may electrically connect the electronic component 1211 through the circuit layer 11 and the interposer 13. The electronic components 1132 may electrically connect the electronic component 1211 through the circuit layer 11 and the interposer 13.

Referring to FIG. 1A, the conductive structure 15 is mounted or disposed on the surface 121 of the circuit layer 12 and covers the electronic component 1211. In some embodiments of the present disclosure, the conductive structure 15 include a metal lid. In some embodiments of the present disclosure, the conductive structure 15 include a heat conductive material. In some embodiments of the present disclosure, the conductive structure 15 include a material with a high thermal conductivity. That is, the thermal conductivity of the conductive structure 15 may be higher than the thermal conductivity of the electronic component 1211 covered by the conductive structure 15.

In some embodiments of the present disclosure, the conductive structure 15 include a laterally extending section 151 and one or more vertically extending sections 152 connecting to the laterally extending section 152. As shown in FIG. 1A, the conductive structure 15 may have a U-shaped cross-section and the electronic component 1211 may be covered by the U-shaped conductive structure 15. The laterally extending section 151 of the conductive structure 15 may have a surface 1511 (e.g., an upper surface) and a surface 1512 (e.g., a lower surface). The electronic component 1211 may be attached to the surface 1512 of the laterally extending section 151 of the conductive structure 15 through an adhesive layer 1210. That is, the adhesive layer 1210 is between the electronic component 1211 and the conductive structure 15. The adhesive layer 1210 is configured to adhere the electronic component 1211 to the surface 1512 of the laterally extending section 151 of the conductive structure 15. In some embodiments of the present disclosure, the adhesive layer 1210 includes a tape, glue or die attach film (DAF). Further, the electronic component 1131 may be attached to the surface 1511 of the laterally extending section 151 of the conductive structure 15 through an adhesive layer 1130. That is, the adhesive layer 1130 is between the electronic component 1131 and the conductive structure 15. The adhesive layer 1310 is configured to adhere the electronic component 1131 to the surface 1511 of the laterally extending section 151 of the conductive structure 15. Moreover, the adhesive layer 1310 may have a high thermal conductivity. In some embodiments of the present disclosure, the adhesive layer 1310 includes thermal interface material (TIM). In some embodiments of the present disclosure, an area of a portion of a lower surface of the electronic component 1131, which is attached to the conductive structure 15, is equal to or greater than two-thirds of a total area of the lower surface of the electronic component 1131.

The vertically extending section 152 of the conductive structure 15 may be connected to the interconnection 120 of the circuit layer 12 through conductive elements 19. Referring to FIG. 1A, the conductive element 19 may be disposed on the surface 121 of the circuit layer 12 and abut the through conductive via 1207 of the interconnection 120 of the circuit layer 12, and the vertically extending section 152 of the conductive structure 15 may connect the conductive element 19. In some embodiments of the present disclosure, the conductive element 19 include a conductive paste or a solder ball. That is, the conductive structure 15 may be electrically connected to the interconnection 120 of the circuit layer 12 through the conductive element 19.

As shown in FIG. 1A, the electronic component 1132 may overlap the conductive structure 15 from a side view perspective. Further, the electronic component 1212 may overlap the conductive structure 15 from the side view perspective. In some embodiments of the present disclosure, an entirety of the conductive structure 15 is arranged under the circuit layer 11.

Referring to FIG. 1A, the conductive structure 15 may be disposed on the surface 121 of the circuit layer 12 and abut against the electronic component 1131 mounted on the surface 113 of the circuit layer 11. That is, the conductive structure 15 is configured to support the circuit layer 11 and the electronic components 1111, 1112, 1113, 1114, 1131, 1132, 1133 mounted on the circuit layer 11. Therefore, the warpage of the circuit layer 11 may be reduced.

Further, as shown in FIG. 1A, the electronic component 1211 and the electronic component 1131 are separated from each other by the conductive structure. Thus, the conductive structure 15 is configured to provide electromagnetic shielding between the electronic component 1211 and the electronic component 1131. Moreover, the electronic component 1211 and the electronic component 1212 are separated from each other by the conductive structure 15. Thus, the conductive structure 15 is configured to provide electromagnetic shielding between the electronic component 1211 and the electronic component 1212.

The encapsulant 14 may be disposed on the surface 111 of the circuit layer 11. The encapsulant 14 may cover the surface 111 of the circuit layer 11 and the electronic components 1111, 1112, 1113 and 1114 disposed on the surface 111 of the circuit layer 11. The encapsulant 14 may include molding compounds, such as a Novolac-based resin, an epoxy-based resin, a silicone-based resin, or other another suitable encapsulant; fillers such as silicon oxide fillers, may be included in the molding compound. In addition, the encapsulant 14 may include a molding underfill (MUF) or a capillary underfill (CUF).

The encapsulant 16 may be disposed on the surface 121 of the circuit layer 12. The encapsulant 16 may cover the surface 113 of the circuit layer 11, the surface 121 of the circuit layer 12, the interposer 13, the conductive structure 15 and the electronic components 1131, 1132, 1133, 1212 and 1213. In some embodiments of the present disclosure, the encapsulant 16 may cover a side surface of the encapsulant 14. The encapsulant 16 may include molding compounds, such as a Novolac-based resin, an epoxy-based resin, a silicone-based resin, or other another suitable encapsulant; fillers such as silicon oxide fillers, may be included in the molding compound. In addition, the encapsulant 16 may include a molding underfill (MUF) or a capillary underfill (CUF). In some embodiments of the present disclosure, the encapsulant 16 extends into a gap between the electronic component 1131 and the circuit layer 11.

The encapsulant 18 may be received in the conductive structure 15 or covered by the conductive structure 15. The encapsulant 18 may cover the surface 1512 of the laterally extending section 151, an inner surface of the vertically extending section 152 and the electronic component 1211. The encapsulant 18 may include molding compounds, such as a Novolac-based resin, an epoxy-based resin, a silicone-based resin, or other another suitable encapsulant; fillers such as silicon oxide fillers, may be included in the molding compound. In addition, the encapsulant 18 may include a molding underfill (MUF) or a capillary underfill (CUF). In some embodiments of the present disclosure, there is a gap 180 between the encapsulant 18 and the surface 121 of the circuit layer 12, and the encapuslant 16 may extend into the gap 180. That is, the gap 180 may be filled with the encapsulant 16.

In addition, the conductive structure 15, the electronic component 1211 covered by the conductive structure 15 and the encapsulant 18 received in the conductive structure 15 and surrounding the electronic component 1211 may be together considered as a sub-package of the semiconductor device package 1.

As shown in FIG. 1A, the surface 113 of the circuit layer 11 may include two regions R1 and R2. The interposer 13 may abut and support the region R1 of the surface 113 of the circuit layer 11 and the electronic component 1131 may connect the region R2 of the surface 113 of the circuit 11 layer and the sub-package and the electronic component 1131 may support the region R2 of the surface 113 of the circuit layer 11. The region R1 may be at a periphery of the circuit layer 11.

Figure 1B:
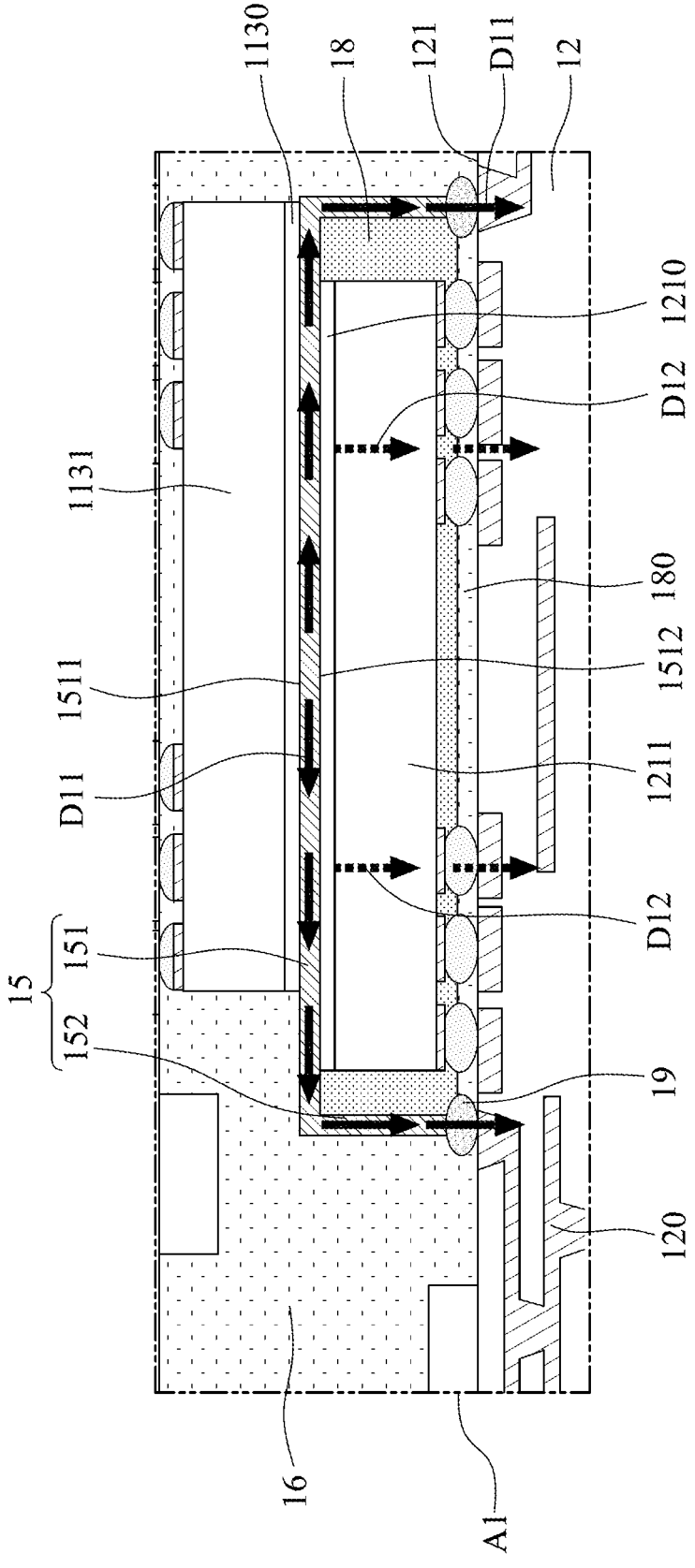
FIG. 1B is an enlarged view of portion "A1" illustrated in FIG. 1A, which illustrates an embodiment of an intermediate structure.

FIG. 1B is an enlarged view of portion "A1" illustrated in FIG. 1A. Especially it illustrates an embodiment of the sub-package of the semiconductor device package 1 as shown in FIG. 1A.

As shown in FIG. 1B, the conductive structure 15 may be disposed on the surface 121 of the circuit layer 12 and connected to the interconnection 120 of the circuit layer 12 through the conductive elements 19. The electronic component 1211 may be attached to the surface 1512 of the laterally extending section 151 of the conductive structure 15 via the adhesive layer 1210, and the electronic component 1131 may be attached to the surface 1511 of the laterally extending section 151 of the conductive structure. The encapsulant 18 may be disposed within the conductive structure 15 and cover the electronic component 1211. The encapsulant 16 may be disposed on the surface 121 of the circuit layer 12 and cover the electronic component 1131 and the conductive structure 15. In addition, the gap 180 between the encapsulant 18 and the surface 121 of the circuit layer 12 may be filled with the encapsulant 16.

Since the electronic component 1131 may be mounted to the circuit layer 11 and arranged between the circuit layer 11 and the circuit layer 12, the heat dissipation of the electronic component 1131 may be an issue for the semiconductor device package 1. In order to dissipate the heat from the electronic component 1131, the conductive structure 15 may function as a heat spreader for the electronic component 1131. Referring to FIG. 1B, the electronic component 1131 may be attached to the conductive structure 15 via the adhesive layer 1130 and the adhesive layer 1310 may have the high thermal conductivity. Thus, the heat generated from the electronic component 1131 may be transferred to the conductive structure 15. Further, the heat flows through the laterally extending section 151 and the vertically extending section 152 of the conductive structure 15 and towards the interconnection 120 of the circuit layer 12 along path shown by arrows D11. Then the heat may flow to the outside of the semiconductor device package 1, such as the main board 100, through the interconnection 120 of the circuit layer 12. Moreover, a portion of the heat generated by the electronic component 1131 may flow to the conductive structure 15 but then flow through the electronic component 1211 and towards the interconnection 120 of the circuit layer 12 along path shown by arrows D21. Then the portion of the heat may flow to the outside of the semiconductor device package 1, such as the main board 100, through the interconnection 120 of the circuit layer 12. However, the thermal conductivity of the conductive structure 15 may be higher than the thermal conductivity of the electronic component 1211. Thus, an amount of the heat flowing along the path shown by arrows D11 may be greater than an amount of the heat flowing along the path shown by arrows D12. Therefore, a heat dissipation efficiency of a heat dissipation path along the path shown by arrows D11, which may be formed by the conductive structure 15 and the circuit layer 12, is higher than a heat dissipation efficiency of a heat dissipation path along the path shown by arrows D12, which may be formed by the conductive structure 15, the electronic component 1211 and the circuit layer 12.

In some embodiments of the present disclosure, the conductive structure 15 is not electrically connected to the electronic component 1131 and/or the electronic component 1211. Thus, the conductive structure 15 may not transfer any signal.

Figure 1C:
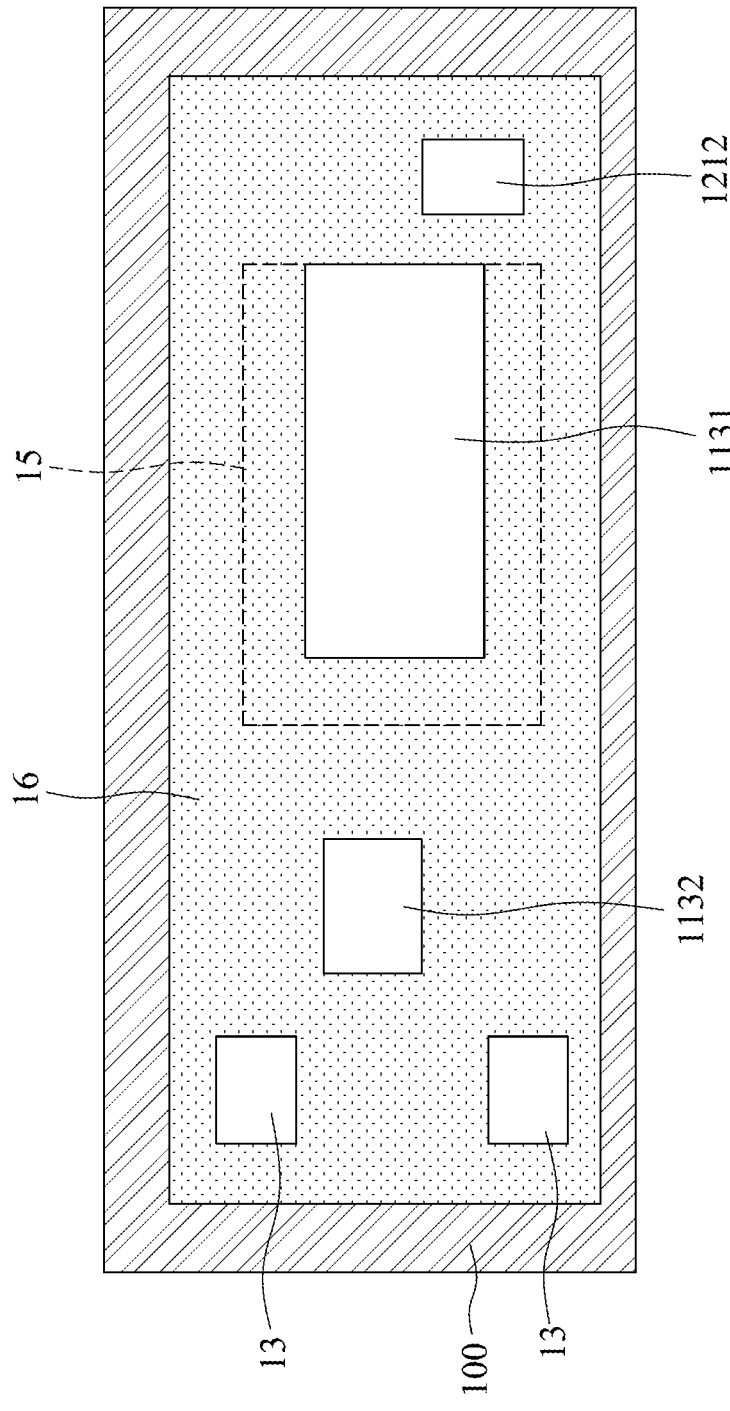
FIG. 1C illustrates a schematic cross-sectional view along line A3-A3 in FIG. 1A.

FIG. 1C illustrates a schematic cross-sectional view along line A3-A3 in FIG. 1A. As shown in FIG. 1C, the semiconductor device package 1 may include two interposers 13 which may be close to a left side of the semiconductor device package 1. Referring to FIG. 1A, the interposer 13 may be disposed on the circuit layer 12 and configured to support the circuit layer 11. Further, the conductive structure 15 may be disposed on the circuit layer 12 and the electronic component 1131 is disposed on the conductive structure 15 and connected to the circuit layer 11. Thus, the conductive structure 15 and the electronic component 1131 may be configured to support the circuit layer 11. Therefore, it may be unnecessary to arrange any interposer on the circuit layer 12 and close to a right side of the semiconductor device package 1 so as to support the circuit layer 11.

Figure 1D:
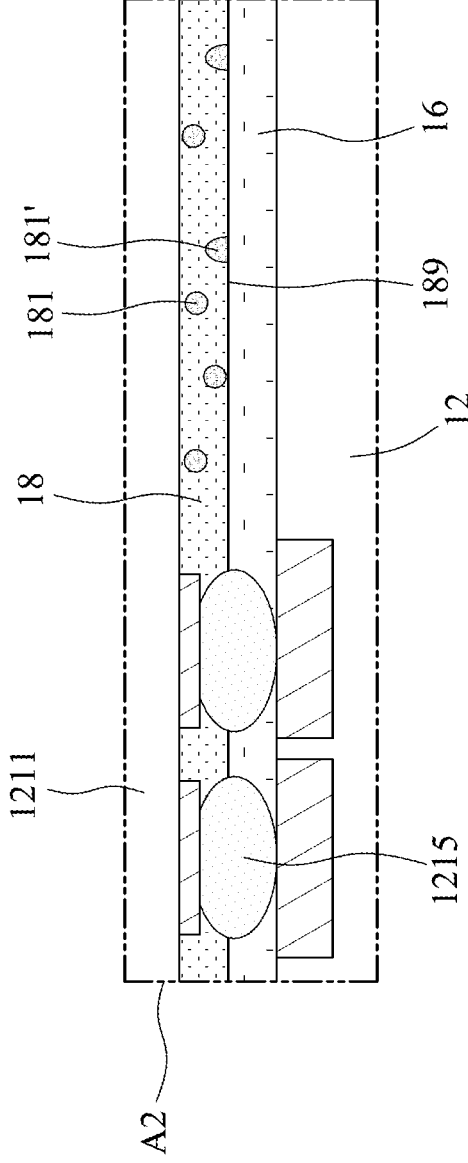
FIG. 1D is an enlarged view of portion "A2" illustrated in FIG. 1A, which illustrates an embodiment of an intermediate structure.

FIG. 1D is an enlarged view of portion "A2" illustrated in FIG. 1A. Referring to FIG. 1D, the encapsulant 18 may include a plurality of fillers 181. Further, the fillers 181 may include a truncated filler 181' adjacent to or abutting a lower surface 189 of the encapsulant 18.

Figure 2A:
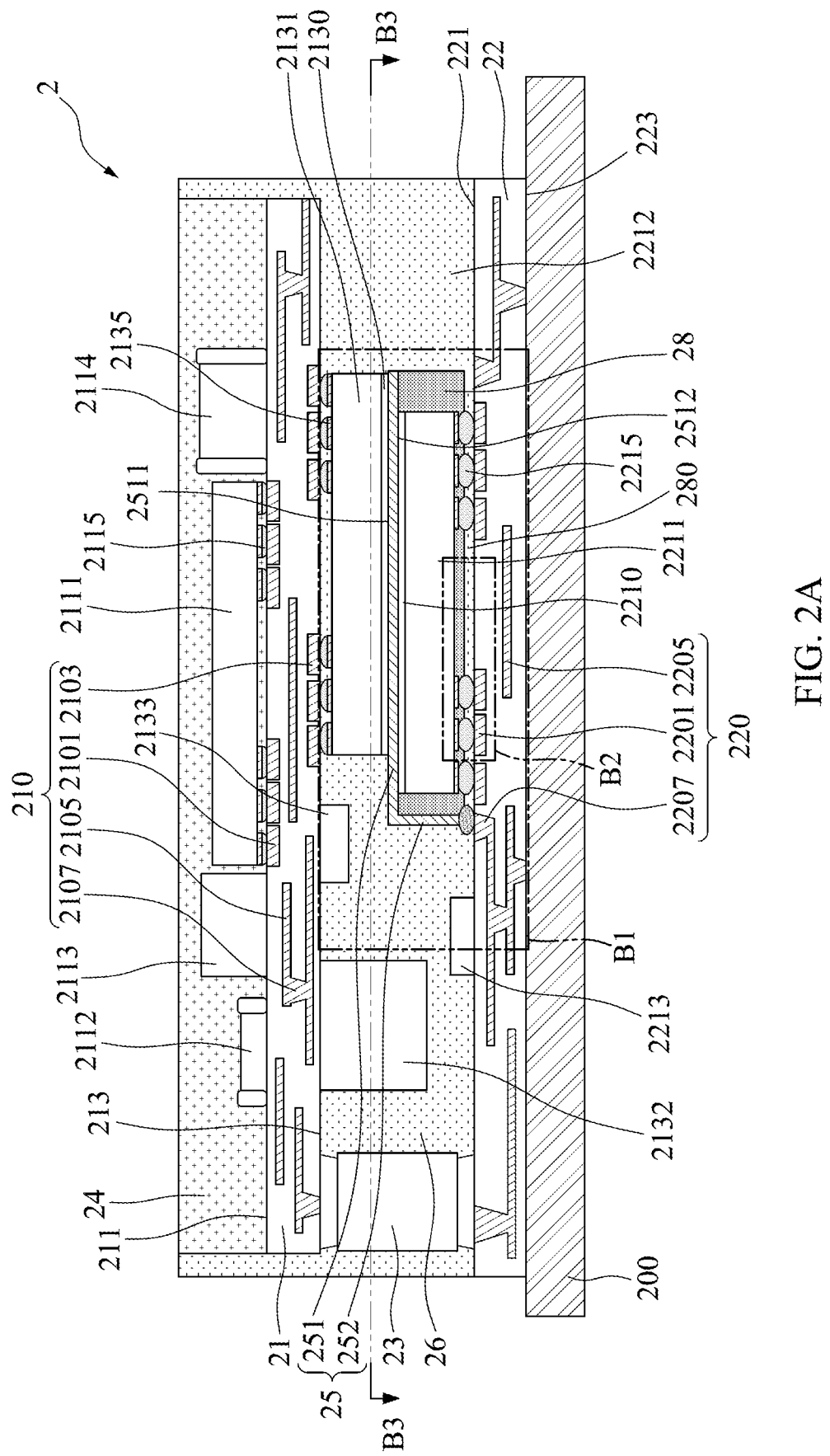
FIG. 2A is a cross-sectional view of a semiconductor device package in accordance with an embodiment of the instant disclosure.

FIG. 2A is a cross-sectional view of a semiconductor device package 2 in accordance with some embodiments of the present disclosure. As shown in FIG. 2A, the semiconductor device package 2 may be a three-dimensional (3D) stacked semiconductor device package. The semiconductor device 2 may include circuit layers 21, 22, an interposer 23, a conductive structure 25, encapsulants 24, 26, 28 and electronic components 2111, 2112, 2113, 2114, 2131, 2132, 2133, 2211. In some embodiments of the present disclosure, the semiconductor device package 2 may be disposed mounted on a main board 200. In some embodiments of the present disclosure, the semiconductor device package 2 may be electrically connected to an interconnection of the main board 200. In some embodiments of the present disclosure, the semiconductor device package 2 may be connected to the main board 200 via solder materials.

Referring to FIG. 2A, the circuit layer 21 may have a surface 211 (e.g., an upper surface) and a surface 213 (e.g., a lower surface). The circuit layer 21 may include an interconnection 210. In some embodiments of the present disclosure, the interconnection 210 includes one or more pads 2101, 2103, one or more redistribution layers 2105 and one or more through conductive vias 2107. Some portions of the interconnection 210 may be exposed from the surfaces 211 and 213 of the circuit layer 21. For example, the pads 2101 may be exposed form the surface 211 of the circuit layer 21, and the pads 2103 may be exposed from the surface 213 of the circuit layer 21.

The electronic components 2111, 2112, 2113 and 2114 may be disposed or mounted on the surface 211 of the circuit layer 21. The electronic component 2111, 2112, 2113, 2114 may be a die, an active device, a passive device, and/or other electronic devices. In some embodiments of the present disclosure, the electronic components 2111, 2112, 2113 and 2114 electrically connects\ the interconnection 210 of the circuit layer 21 via electrical connections. For example, the electronic component 2111 is electrically connected to the pads 2101 of the interconnection 210 of the circuit layer 21 via electrical connections 2115. In some embodiments of the present disclosure, the electrical connection 2115 includes a reflowable material. In some embodiments of the present disclosure, the electrical connection 2115 includes solder material. The electrical connection 2115 may include a solder ball. Further, the electronic components 2131, 2132 and 2133 may be disposed or mounted on the surface 213 of the circuit layer 21. The electronic component 2131, 2132, 2133 may be a die, an active device, a passive device, and/or other electronic devices. In some embodiments of the present disclosure, the electronic components 2131, 2132 and 2133 electrically connect the interconnection 210 of the circuit layer 21 via electrical connections. For example, the electronic component 2131 is electrically connected to the pads 2103 of the interconnection 210 of the circuit layer 11 via electrical connections 2135. In some embodiments of the present disclosure, the electrical connection 2135 includes a reflowable material. In some embodiments of the present disclosure, the electrical connection 2135 includes solder material. The electrical connection 2135 may include a solder ball.

The circuit layer 22 may be arranged under the circuit layer 21. The circuit layer 12 may have a surface 221 (e.g., an upper surface) and a surface 223 (e.g., a lower surface). The circuit layer 22 may include an interconnection 220. In some embodiments of the present disclosure, the interconnection 220 includes one or more pads 2201, one or more redistribution layers 2205 and one or more through conductive vias 2207. Some portions of the interconnection 220 may be exposed from the surfaces 221 and 223 of the circuit layer 22. For example, the pads 2201 may be exposed form the surface 221 of the circuit layer 22.

The electronic component 2211 may be disposed or mounted on the surface 221 of the circuit layer 22. The electronic component 2221 may be a die, an active device, a passive device, and/or other electronic devices. In some embodiments of the present disclosure, the electronic component 2211 electrically connects the interconnection 220 of the circuit layer 22 via electrical connections. For example, the electronic component 2211 is electrically connected to the pads 2201 of the interconnection 220 of the circuit layer 22 via electrical connections 2215. In some embodiments of the present disclosure, the electrical connection 2215 includes a reflowable material. In some embodiments of the present disclosure, the electrical connection 2215 includes solder material. The electrical connection 2215 may include a solder ball.

The interposers 23 may be disposed or mounted on the surface 221 of the circuit layer 22 and the surface 213 of the circuit layer 21. That is, the interposer 23 may be arranged between the circuit layer 21 and the circuit layer 22. Thus, the interposer 23 is configured to support the circuit layer 21 such that the circuit layer 21 is disposed above or over the circuit layer 22. Moreover, the interposer 23 may have an interconnection and electrically connect the interconnection 210 of the circuit layer 21 via electrical connections and electrically connect the interconnection 220 of the circuit layer 22 via electrical connections. That is, the interposer 23 is configured to transfer a signal from the circuit layer 21 and/or the electronic components 2111, 2112, 2113, 2114, 2131, 2132 and/or 2133 mounted on the circuit layer 21 to the circuit layer 22 and/or the electronic component 2211 mounted on the circuit layer 22 and/or to transfer a signal from the circuit layer 22 and/or the electronic component 2211 mounted on the circuit layer 22 to the circuit layer 21 and/or the electronic components 2111, 2112, 2113, 2114, 2131, 2132 and/or 2133 mounted on the circuit layer 21. In some embodiments of the present disclosure, the interposer 23 includes a substrate.

The electronic components 2111 may electrically connect the electronic component 2211 through the circuit layer 21 and the interposer 23. The electronic components 2131 may electrically connect the electronic component 2211 through the circuit layer 21 and the interposer 23. The electronic components 2132 may electrically connect the electronic component 2211 through the circuit layer 21 and the interposer 23.

Referring to FIG. 2A, the conductive structure 25 is mounted or disposed on the surface 221 of the circuit layer 22 and covers the electronic component 2211. In some embodiments of the present disclosure, the conductive structure 25 include a metal lid. In some embodiments of the present disclosure, the conductive structure 25 include a heat conductive material. In some embodiments of the present disclosure, the conductive structure 25 include a material with a high thermal conductivity. That is, the thermal conductivity of the conductive structure 25 may be higher than the thermal conductivity of the electronic component 2211 covered by the conductive structure 25.

In some embodiments of the present disclosure, the conductive structure 25 include a laterally extending section 251 and one or more vertically extending sections 252 connecting to the laterally extending section 252. As shown in FIG. 2A, the conductive structure 25 may have a L-shaped cross-section and the electronic component 2211 may be covered by the L-shaped conductive structure 25. The laterally extending section 251 of the conductive structure 25 may have a surface 2511 (e.g., an upper surface) and a surface 2512 (e.g., a lower surface). The electronic component 2211 may be attached to the surface 2512 of the laterally extending section 251 of the conductive structure 25 through an adhesive layer 2210. That is, the adhesive layer 2210 is between the electronic component 2211 and the conductive structure 25. The adhesive layer 2210 is configured to adhere the electronic component 2211 to the surface 2512 of the laterally extending section 251 of the conductive structure 25. In some embodiments of the present disclosure, the adhesive layer 2210 includes a tape, glue or die attach film (DAF). Further, the electronic component 2131 may be attached to the surface 2511 of the laterally extending section 251 of the conductive structure 25 through an adhesive layer 2130. That is, the adhesive layer 2130 is between the electronic component 2131 and the conductive structure 25. The adhesive layer 2310 is configured to adhere the electronic component 2131 to the surface 2511 of the laterally extending section 251 of the conductive structure 25. Moreover, the adhesive layer 1310 may have a high thermal conductivity. In some embodiments of the present disclosure, the adhesive layer 2310 includes thermal interface material (TIM). In some embodiments of the present disclosure, an area of a portion of a lower surface of the electronic component 2131, which is attached to the conductive structure 25, is equal to or greater than two-thirds of a total area of the lower surface of the electronic component 2131.

The vertically extending section 252 of the conductive structure 25 may be connected to the interconnection 220 of the circuit layer 22 through conductive elements 29. Referring to FIG. 2A, the conductive element 29 may be disposed on the surface 221 of the circuit layer 22 and abut the through conductive via 2207 of the interconnection 220 of the circuit layer 22, and the vertically extending section 252 of the conductive structure 25 may connect the conductive element 29. In some embodiments of the present disclosure, the conductive element 29 include a conductive paste or a solder ball. That is, the conductive structure 25 may be electrically connected to the interconnection 220 of the circuit layer 22 through the conductive element 29.

As shown in FIG. 2A, the electronic component 2132 may overlap the conductive structure 25 from a side view perspective. In some embodiments of the present disclosure, an entirety of the conductive structure 25 is arranged under the circuit layer 21.

Referring to FIG. 2A, the conductive structure 25 may be disposed on the surface 221 of the circuit layer 22 and abut against the electronic component 2131 mounted on the surface 213 of the circuit layer 21. That is, the conductive structure 15 is configured to support the circuit layer 21 and the electronic components 2111, 2112, 2113, 2114, 2131, 2132, 2133 mounted on the circuit layer 21. Therefore, the warpage of the circuit layer 21 may be reduced.

Further, as shown in FIG. 2A, the electronic component 2211 and the electronic component 2131 are separated from each other by the conductive structure 25. Thus, the conductive structure 25 is configured to provide electromagnetic shielding between the electronic component 2211 and the electronic component 2131.

The encapsulant 24 may be disposed on the surface 211 of the circuit layer 21. The encapsulant 24 may cover the surface 211 of the circuit layer 21 and the electronic components 2111, 2112, 2113 and 2114 disposed on the surface 211 of the circuit layer 21. The encapsulant 24 may include molding compounds, such as a Novolac-based resin, an epoxy-based resin, a silicone-based resin, or other another suitable encapsulant; fillers such as silicon oxide fillers, may be included in the molding compound. In addition, the encapsulant 24 may include a molding underfill (MUF) or a capillary underfill (CUF).

The encapsulant 26 may be disposed on the surface 221 of the circuit layer 22. The encapsulant 26 may cover the surface 213 of the circuit layer 21, the surface 221 of the circuit layer 22, the interposer 23, the conductive structure

25 and the electronic components 2131, 2132 and 2133. In some embodiments of the present disclosure, the encapsulant 26 may cover a side surface of the encapsulant 24. The encapsulant 26 may include molding compounds, such as a Novolac-based resin, an epoxy-based resin, a silicone-based resin, or other another suitable encapsulant; fillers such as silicon oxide fillers, may be included in the molding compound. In addition, the encapsulant 26 may include a molding underfill (MUF) or a capillary underfill (CUF). In some embodiments of the present disclosure, the encapsulant 26 extends into a gap between the electronic component 2131 and the circuit layer 21.

The encapsulant 28 may be received in the conductive structure 25 or covered by the conductive structure 25. The encapsulant 28 may cover the surface 2512 of the laterally extending section 251, an inner surface of the vertically extending section 252 and the electronic component 2211. The encapsulant 28 may include molding compounds, such as a Novolac-based resin, an epoxy-based resin, a silicone-based resin, or other another suitable encapsulant; fillers such as silicon oxide fillers, may be included in the molding compound. In addition, the encapsulant 28 may include a molding underfill (MUF) or a capillary underfill (CUF). In some embodiments of the present disclosure, there is a gap 280 between the encapsulant 28 and the surface 221 of the circuit layer 22, and the encapuslant 26 may extend into the gap 280. That is, the gap 280 may be filled with the encapsulant 26.

In addition, the conductive structure 25, the electronic component 2211 covered by the conductive structure 25 and the encapsulant 28 received in the conductive structure 25 and surrounding the electronic component 2211 may be together considered as a sub-package of the semiconductor device package 2.

Figure 2B:
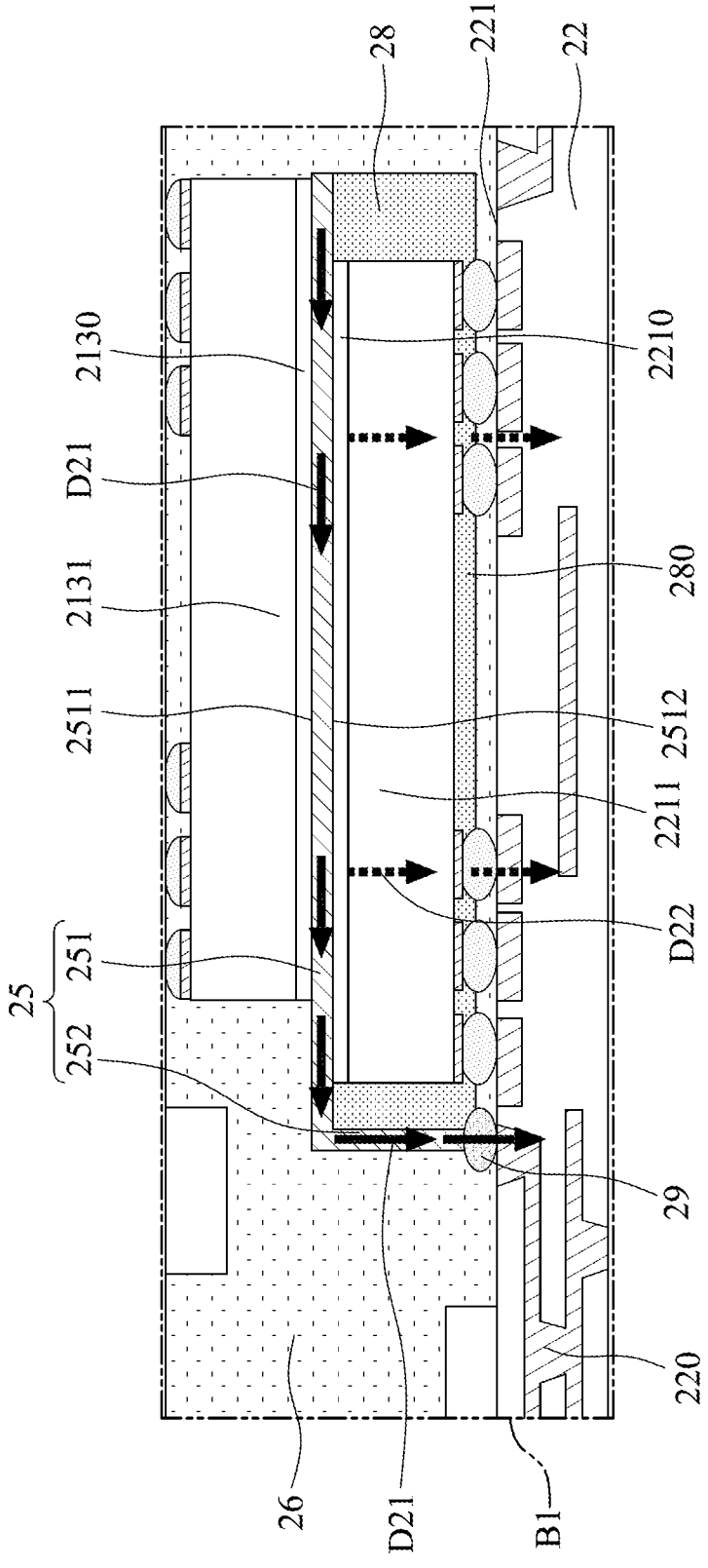
FIG. 2B is an enlarged view of portion "B" illustrated in FIG. 2A, which illustrates an embodiment of an intermediate structure.

FIG. 2B is an enlarged view of portion "B1" illustrated in FIG. 2A. Especially it illustrates an embodiment of the sub-package of the semiconductor device package 2 as shown in FIG. 2A.

As shown in FIG. 2B, the conductive structure 25 may be disposed on the surface 221 of the circuit layer 22 and connected to the interconnection 220 of the circuit layer 22 through the conductive elements 29. The electronic component 2211 may be attached to the surface 2512 of the laterally extending section 251 of the conductive structure 25 via the adhesive layer 2210, and the electronic component 2131 may be attached to the surface 2511 of the laterally extending section 251 of the conductive structure. The encapsulant 28 may be disposed within the conductive structure 25 and cover the electronic component 2211. The encapsulant 26 may be disposed on the surface 221 of the circuit layer 22 and cover the electronic component 2131 and the conductive structure 25. In addition, the gap 280 between the encapsulant 28 and the surface 221 of the circuit layer 12 may be filled with the encapsulant 26.

Since the electronic component 2131 may be mounted to the circuit layer 21 and arranged between the circuit layer 21 and the circuit layer 22, the heat dissipation of the electronic component 2131 may be an issue for the semiconductor device package 2. In order to dissipate the heat from the electronic component 2131, the conductive structure 25 may function as a heat spreader for the electronic component 2131. Referring to FIG. 2B, the electronic component 2131 may be attached to the conductive structure 25 via the adhesive layer 2130 and the adhesive layer 2310 may have the high thermal conductivity. Thus, the heat generated by the electronic component 2131 may be transferred to the conductive structure 25. Further, the heat flows through the laterally extending section 251 and the vertically extending section 252 of the conductive structure 25 and towards the interconnection 220 of the circuit layer 22 along path shown by arrows D21. Then the heat may flow to the outside of the semiconductor device package 2, such as the main board 200, through the interconnection 220 of the circuit layer 22. Moreover, a portion of the heat generated by the electronic component 2131 may flow to the conductive structure 25 but then flow through the electronic component 2211 and towards the interconnection 220 of the circuit layer 22 along path shown by arrows D22. Then the portion of the heat may flow to the outside of the semiconductor device package 2, such as the main board 200, through the interconnection 220 of the circuit layer 22. However, the thermal conductivity of the conductive structure 25 may be higher than the thermal conductivity of the electronic component 2211. Thus, an amount of the heat flowing along the path shown by arrows D21 may be greater than an amount of the heat flowing along the path shown by arrows D22. Therefore, a heat dissipation efficiency of a heat dissipation path along the path shown by arrows D21, which may be formed by the conductive structure 25 and the circuit layer 22, is higher than a heat dissipation efficiency of a heat dissipation path along the path shown by arrows D22, which may be formed by the conductive structure 25, the electronic component 2211 and the circuit layer 22.

In some embodiments of the present disclosure, the conductive structure 25 is not electrically connected to the electronic component 2131 and/or the electronic component 2211. Thus, the conductive structure 25 may not transfer any signal.

Figure 2C:
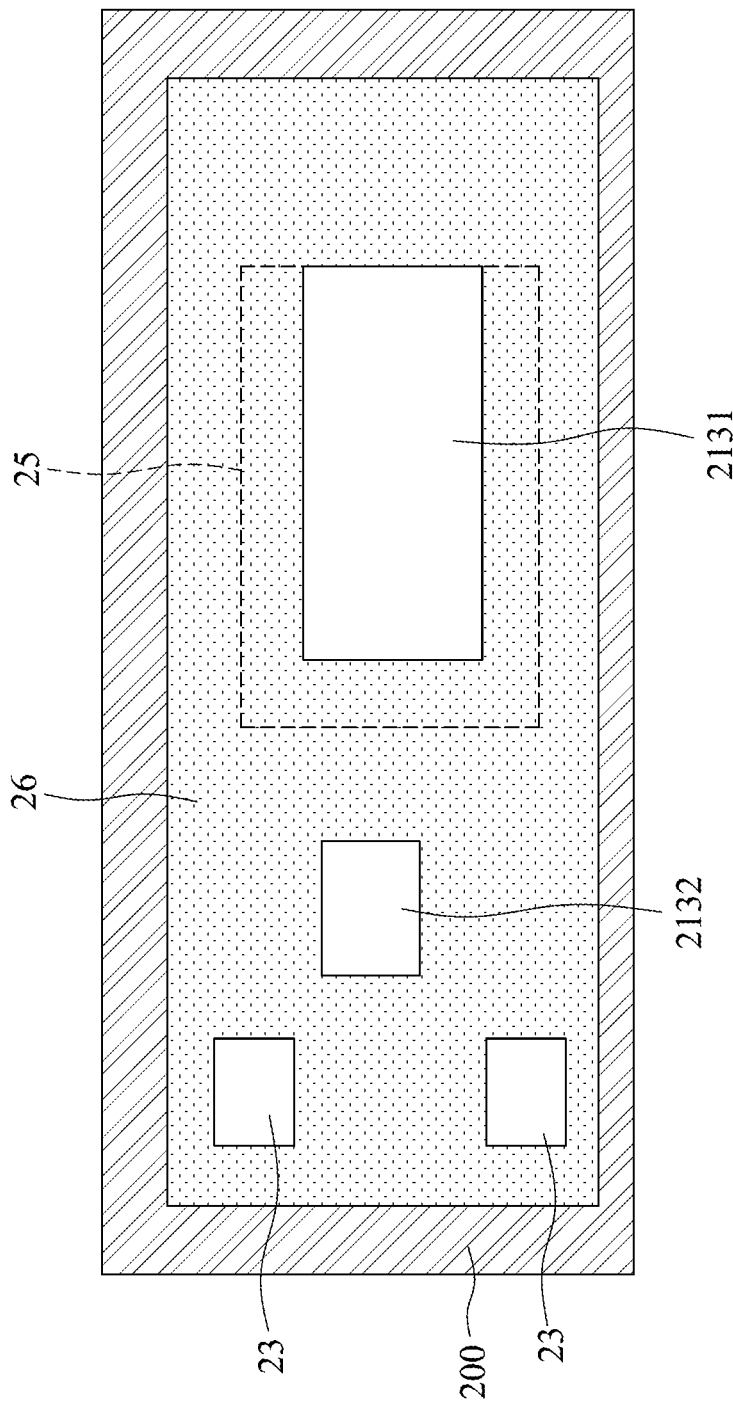
FIG. 2C illustrates a schematic cross-sectional view along line B3-B3 in FIG. 2A.

FIG. 2C illustrates a schematic cross-sectional view along line B3-B3 in FIG. 2A. As shown in FIG. 2C, the semiconductor device package 2 may include two interposers 23 which may be close to a left side of the semiconductor device package 2. Referring to FIG. 2A, the interposer 23 may be disposed on the circuit layer 22 and configured to support the circuit layer 21. Further, the conductive structure 25 may be disposed on the circuit layer 22 and the electronic component 2131 is disposed on the conductive structure 25 and connected to the circuit layer 21. Thus, the conductive structure 25 and the electronic component 2131 may be configured to support the circuit layer 21. Therefore, it may be unnecessary to arrange any interposer on the circuit layer 22 and close to a right side of the semiconductor device package 2 so as to support the circuit layer 21.

Figure 2D:
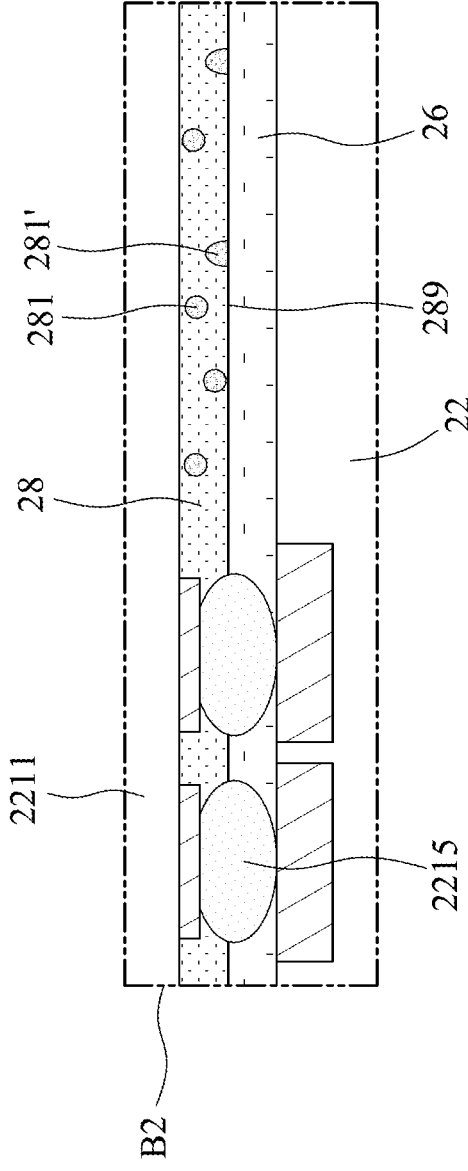
FIG. 2D is an enlarged view of portion "B2" illustrated in FIG. 2A, which illustrates an embodiment of an intermediate structure.

FIG. 2D is an enlarged view of portion "B2" illustrated in FIG. 2A. Referring to FIG. 2D, the encapsulant 28 may include a plurality of fillers 281. Further, the fillers 281 may include a truncated filler 281' adjacent to or abutting a lower surface 289 of the encapsulant 28.

Figure 3:
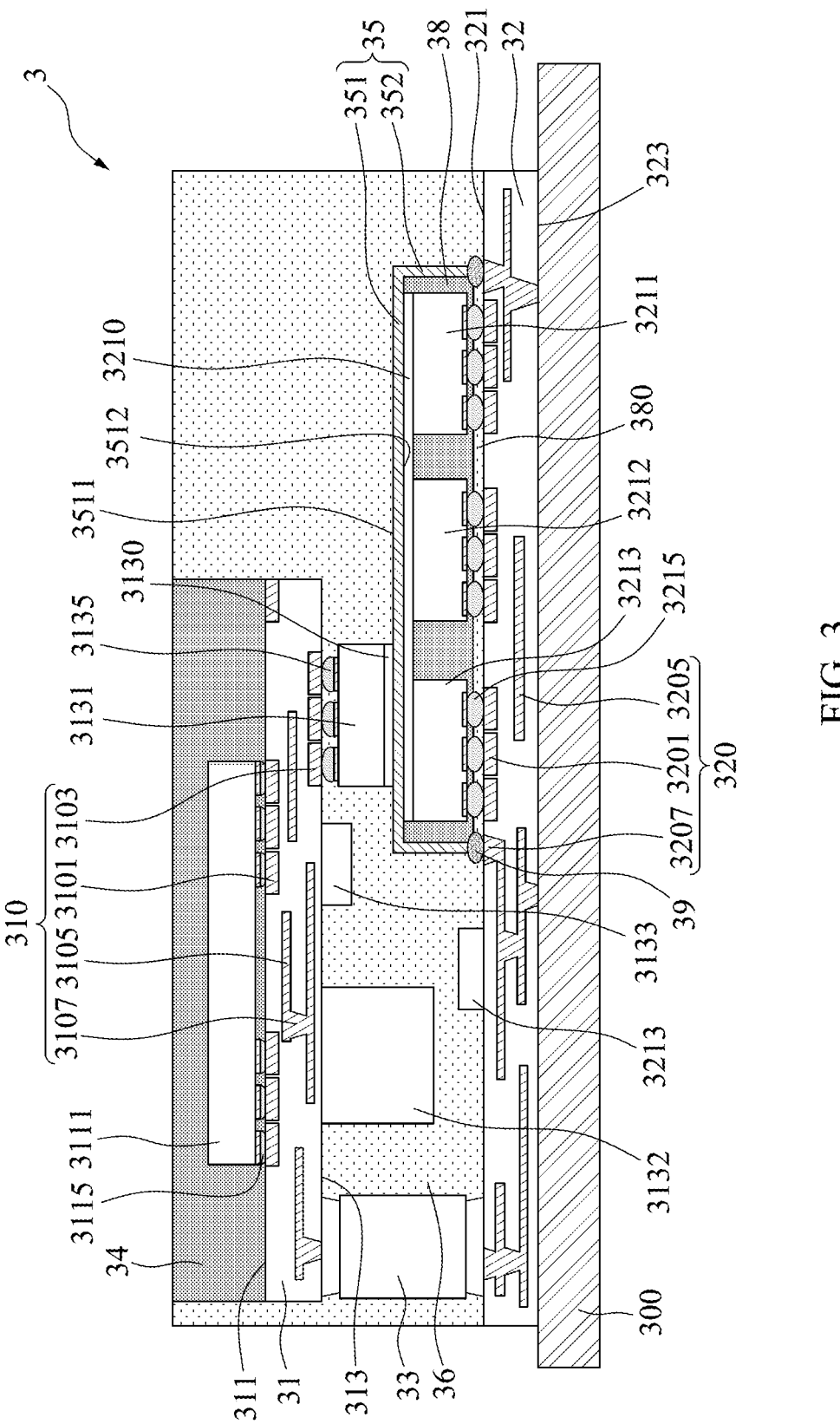
FIG. 3 is a cross-sectional view of a semiconductor device package in accordance with an embodiment of the instant disclosure.

FIG. 3 is a cross-sectional view of a semiconductor device package 3 in accordance with some embodiments of the present disclosure. As shown in FIG. 3, the semiconductor device package 3 may be a three-dimensional (3D) stacked semiconductor device package. The semiconductor device 3 may include circuit layers 31, 32, an interposer 33, a conductive structure 35, encapsulants 34, 36, 38 and electronic components 3111, 3131, 3132, 3211, 3212, 3213 and 3214. In some embodiments of the present disclosure, the semiconductor device package 3 may be disposed mounted on a main board 300. In some embodiments of the present disclosure, the semiconductor device package 3 may be electrically connected to an interconnection of the main board 300.

Referring to FIG. 3, the circuit layer 31 may have a surface 311 (e.g., an upper surface) and a surface 313 (e.g., a lower surface). The circuit layer 13 may include an interconnection 310. In some embodiments of the present disclosure, the interconnection 310 includes one or more pads 3101, 3103, one or more redistribution layers 3105 and one or more through conductive vias 3107. Some portions of the interconnection 310 may be exposed from the surfaces 311 and 313 of the circuit layer 31. For example, the pads 3101 may be exposed form the surface 311 of the circuit layer 31, and the pads 3103 may be exposed from the surface 313 of the circuit layer 31.

The electronic component 3111 may be disposed or mounted on the surface 111 of the circuit layer 31. The electronic component 3111 may be a die, an active device, a passive device, and/or other electronic devices. In some embodiments of the present disclosure, the electronic component 3111 electrically connects the interconnection 310 of the circuit layer 31 via electrical connections. For example, the electronic component 3111 is electrically connected to the pads 3101 of the interconnection 310 of the circuit layer 31 via electrical connections 3115. In some embodiments of the present disclosure, the electrical connection 3115 includes a reflowable material. In some embodiments of the present disclosure, the electrical connection 3115 includes solder material. The electrical connection 3115 may include a solder ball. Further, the electronic components 3131, 3132 and 3133 may be disposed or mounted on the surface 313 of the circuit layer 31. The electronic component 3131, 3132, 3133 may be a die, an active device, a passive device, and/or other electronic devices. In some embodiments of the present disclosure, the electronic components 3131, 3132 and 3133 electrically connect the interconnection 310 of the circuit layer 31 via electrical connections. For example, the electronic component 3131 is electrically connected to the pads 3103 of the interconnection 310 of the circuit layer 31 via electrical connections 3135. In some embodiments of the present disclosure, the electrical connection 3135 includes a reflowable material. In some embodiments of the present disclosure, the electrical connection 3135 includes solder material. The electrical connection 3135 may include a solder ball.

The circuit layer 32 may be arranged under the circuit layer 31. The circuit layer 32 may have a surface 321 (e.g., an upper surface) and a surface 323 (e.g., a lower surface). The circuit layer 32 may include an interconnection 320. In some embodiments of the present disclosure, the interconnection 320 includes one or more pads 3201, one or more redistribution layers 3205 and one or more through conductive vias 3207. Some portions of the interconnection 320 may be exposed from the surfaces 321 and 323 of the circuit layer 32. For example, the pads 3201 may be exposed form the surface 321 of the circuit layer 32. In some embodiments of the present disclosure, a cross-sectional width of the circuit layer 32 is greater than a cross-sectional width of the circuit layer 31.

The electronic components 3211, 3212, 3213 and 3214 may be disposed or mounted on the surface 321 of the circuit layer 32. The electronic component 3211, 3212, 3213, 3214 may be a die, an active device, a passive device, and/or other electronic devices. In some embodiments of the present disclosure, the electronic components 3211, 3212, 3213 and 3214 electrically connect the interconnection 320 of the circuit layer 32 via electrical connections. For example, the electronic component 3211 is electrically connected to the pads 3201 of the interconnection 320 of the circuit layer 32 via electrical connections 3215. In some embodiments of the present disclosure, the electrical connection 3215 includes a reflowable material. In some embodiments of the present disclosure, the electrical connection 3215 includes solder material. The electrical connection 3215 may include a solder ball.

The interposers 33 may be disposed or mounted on the surface 321 of the circuit layer 32 and the surface 313 of the circuit layer 31. That is, the interposer 33 may be arranged between the circuit layer 31 and the circuit layer 32. Thus, the interposer 33 is configured to support the circuit layer 31 such that the circuit layer 31 is disposed above or over the circuit layer 32. Moreover, the interposer 33 may have an interconnection and electrically connect the interconnection 310 of the circuit layer 31 via electrical connections and electrically connect the interconnection 320 of the circuit layer 32 via electrical connections. That is, the interposer 33 is configured to transfer a signal from the circuit layer 31 and/or the electronic components 3111, 3131, 3132 and/or 3133 mounted on the circuit layer 31 to the circuit layer 32 and/or the electronic components 3211, 3212, 3213 and/or 3214 mounted on the circuit layer 32 and/or to transfer a signal from the circuit layer 32 and/or the electronic components 3211, 3212, 3213 and/or 3214 mounted on the circuit layer 32 to the circuit layer 31 and/or the electronic components 1111, 3131, 3132 and/or 3133 mounted on the circuit layer 31. In some embodiments of the present disclosure, the interposer 33 includes a substrate.

Referring to FIG. 3, the conductive structure 35 is mounted or disposed on the surface 321 of the circuit layer 32 and covers the electronic components 3211, 3212 and 3213. In some embodiments of the present disclosure, the conductive structure 35 include a metal lid. In some embodiments of the present disclosure, the conductive structure 35 include a heat conductive material. In some embodiments of the present disclosure, the conductive structure 35 include a material with a high thermal conductivity. That is, the thermal conductivity of the conductive structure 35 may be higher than the thermal conductivity of the electronic component 3211, 3212, 3213 covered by the conductive structure 35.

In some embodiments of the present disclosure, the conductive structure 35 include a laterally extending section 351 and one or more vertically extending sections 352 connecting to the laterally extending section 352. As shown in FIG. 3, the conductive structure 35 may have a U-shaped cross-section and the electronic components 3211, 3212 and 3213 may be covered by the U-shaped conductive structure 35. The laterally extending section 351 of the conductive structure 35 may have a surface 3511 (e.g., an upper surface) and a surface 3512 (e.g., a lower surface). The electronic components 3211, 3212, 3213 may be attached to the surface 3512 of the laterally extending section 351 of the conductive structure 35 through an adhesive layer 3210. That is, the adhesive layer 3210 is between the electronic component 3211, 3212, 3213 and the conductive structure 35. The adhesive layer 3210 is configured to adhere the electronic components 3211, 3212, 3213 to the surface 3512 of the laterally extending section 351 of the conductive structure 35. In some embodiments of the present disclosure, the adhesive layer 3210 includes a tape, glue or die attach film (DAF). Further, the electronic component 3131 may be attached to the surface 3511 of the laterally extending section 351 of the conductive structure 35 through an adhesive layer 3130. That is, the adhesive layer 3130 is between the electronic component 3131 and the conductive structure 35. The adhesive layer 3310 is configured to adhere the electronic component 3131 to the surface 3511 of the laterally extending section 351 of the conductive structure 35. Moreover, the adhesive layer 3310 may have a high thermal conductivity. In some embodiments of the present disclosure, the adhesive layer 3310 includes thermal interface material (TIM). In some embodiments of the present disclosure, an area of a portion of a lower surface of the electronic component 3131, which is attached to the conductive structure 3, is equal to or greater than two-thirds of a total area of the lower surface of the electronic component 3131.

The vertically extending section 352 of the conductive structure 35 may be connected to the interconnection 320 of the circuit layer 32 through conductive elements 39. Referring to FIG. 3, the conductive element 39 may be disposed on the surface 321 of the circuit layer 32 and abut the through conductive via 3207 of the interconnection 320 of the circuit layer 32, and the vertically extending section 352 of the conductive structure 35 may connect the conductive element 39. In some embodiments of the present disclosure, the conductive element 39 include a conductive paste or a solder ball. That is, the conductive structure 35 may be electrically connected to the interconnection 320 of the circuit layer 32 through the conductive element 39.

As shown in FIG. 3, the electronic component 3132 may overlap the conductive structure 35 from a side view perspective. Further, a portion of the conductive structure 35 may not be covered by the circuit layer 31 from a top view perspective. In some embodiments of the present disclosure, an entirety of the conductive structure 35 is arranged under the circuit layer 31.

Referring to FIG. 3, the conductive structure 35 may be disposed on the surface 321 of the circuit layer 32 and abut against the electronic component 3131 mounted on the surface 313 of the circuit layer 31. That is, the conductive structure 35 is configured to support the circuit layer 31 and the electronic components 3111, 3131, 3132, 3133 mounted on the circuit layer 31. Therefore, the warpage of the circuit layer 31 may be reduced.

As shown in FIG. 3, the electronic components 3211, 3212, 3213 and the electronic component 3131 are separated from each other by the conductive structure 35. Thus, the conductive structure 35 is configured to provide electromagnetic shielding between the electronic components 3211, 3212, 3213 and the electronic component 3131.

The encapsulant 34 may be disposed on the surface 311 of the circuit layer 11. The encapsulant 34 may cover the surface 311 of the circuit layer 31 and the electronic component 3111 disposed on the surface 311 of the circuit layer 31. The encapsulant 34 may include molding compounds, such as a Novolac-based resin, an epoxy-based resin, a silicone-based resin, or other another suitable encapsulant; fillers such as silicon oxide fillers, may be included in the molding compound. In addition, the encapsulant 34 may include a molding underfill (MUF) or a capillary underfill (CUF).

The encapsulant 36 may be disposed on the surface 321 of the circuit layer 32. The encapsulant 36 may cover the surface 313 of the circuit layer 31, the surface 321 of the circuit layer 32, the interposer 33, the conductive structure 35 and the electronic components 3131, 3132, 3133 and 3214. In some embodiments of the present disclosure, the encapsulant 36 may cover a side surface of the encapsulant 34. The encapsulant 36 may include molding compounds, such as a Novolac-based resin, an epoxy-based resin, a silicone-based resin, or other another suitable encapsulant; fillers such as silicon oxide fillers, may be included in the molding compound. In addition, the encapsulant 36 may include a molding underfill (MUF) or a capillary underfill (CUF).

The encapsulant 38 may be received in the conductive structure 35 or covered by the conductive structure 35. The encapsulant 38 may cover the surface 3512 of the laterally extending section 351, an inner surface of the vertically extending section 352 and the electronic components 3211, 3212 and 3213. The encapsulant 38 may include molding compounds, such as a Novolac-based resin, an epoxy-based resin, a silicone-based resin, or other another suitable encapsulant; fillers such as silicon oxide fillers, may be included in the molding compound. In addition, the encapsulant 18 may include a molding underfill (MUF) or a capillary underfill (CUF). In some embodiments of the present disclosure, there is a gap 380 between the encapsulant 38 and the surface 321 of the circuit layer 32, and the encapuslant 36 may extend into the gap 380. That is, the gap 380 may be filled with the encapsulant 36.

In addition, the conductive structure 35, the electronic components 3211, 3212 and 3213 covered by the conductive structure 35 and the encapsulant 38 received in the conductive structure 35 and surrounding the electronic components 3211, 3212 and 3213 may be together considered as a sub-package of the semiconductor device package 3.

As above-mentioned, the conductive structure 15 may have the high thermal conductivity. Thus, the conductive structure 35 may function as a heat spreader for the electronic component 3131. As shown in FIG. 3, the electronic component 3131 may be attached to the conductive structure 35 via the adhesive layer 3130 and the adhesive layer 3310 may have the high thermal conductivity. Thus, the heat generated by the electronic component 3131 may be transferred to the conductive structure 35. Further, the heat flows through the laterally extending section 351 and the vertically extending section 352 of the conductive structure 35 and towards the interconnection 320 of the circuit layer 32. Then the heat may flow to the outside of the semiconductor device package 3, such as the main board 300, through the interconnection 320 of the circuit layer 32. Given the above, the conductive structure 35 is configured to dissipate the heat generated by the electronic component 3131.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L and FIG. 4M illustrate a method of manufacturing a semiconductor device package 4 in accordance with another embodiment of the instant disclosure.

Figure 4A:
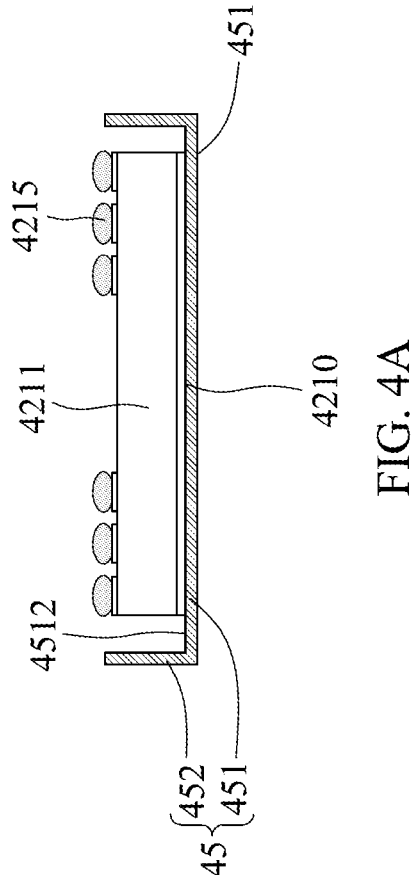
FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L and FIG. 4M illustrate a method of manufacturing a semiconductor device package in accordance with another embodiment of the instant disclosure.

Referring to FIG. 4A, a conductive structure 45 is provided and an electronic component 4211 is mounted to the conductive structure 45. As shown in FIG. 4A, the conductive structure 45 has a U-shaped cross-section and includes a laterally extending section 451 and at least two vertically extending sections 452. The electronic component 4211 is attached to a surface 4512 of the laterally extending section 451 of the conductive structure 45 via an adhesive layer 4210. In some embodiments of the present disclosure, the electrical connections 4215 are disposed on the electronic component 4211.

Figure 4B:
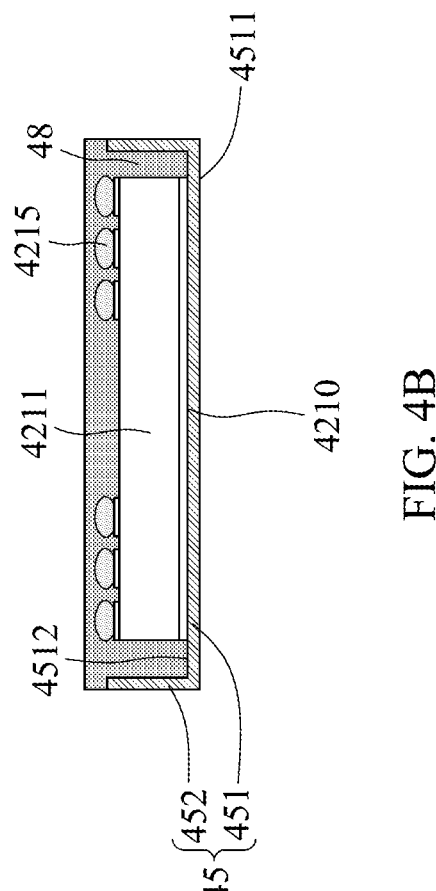

Referring to FIG. 4B, the encapsulant 48 is provided. The encapsulant 48 may be formed within the U-shaped conductive structure and cover the electronic component 4211, the electrical connections 4215 and the inner surface of the vertically extending section 452 and the surface 4512 of the laterally extending section 451 of the conductive structure 45.

Figure 4C:
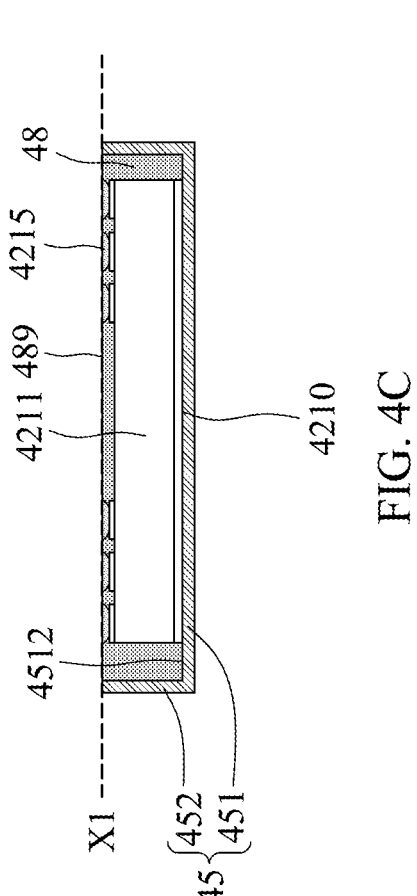

Referring to FIG. 4C, a grinding process is conducted to cut along the imaginary line "X1" through the encapsulant 48 and the electrical connections 4215, such that an upper surface of the encapsulant 48 and/or top surfaces of the electrical connections 4215 may substantially align with a top end of the vertically extending section 452 of the conductive structure 45. Thus, a sub-package is obtained. Since the grinding process is conducted, the encapsulant 48 may include a truncated filler abutting the surface 489 of the encapsulant 48.

Figure 4D:
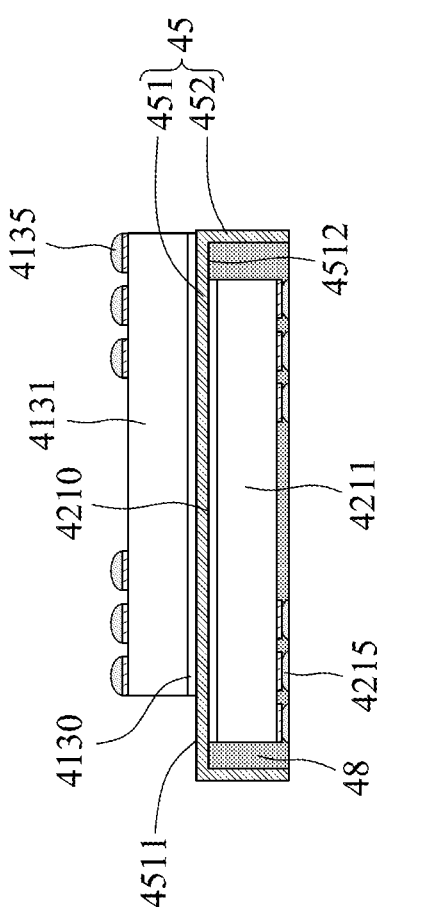

Referring to FIG. 4D, the sub-package obtained from FIG. 4C may be reversed upside down and an electronic component 4131 is mounted to the conductive structure 45. As shown in FIG. 4D, the electronic component 4131 is attached to a surface 4511 of the laterally extending section 451 of the conductive structure 45 via an adhesive layer 4130. In some embodiments of the present disclosure, the electrical connections 4135 are disposed on the electronic component 4131.

Figure 4E:
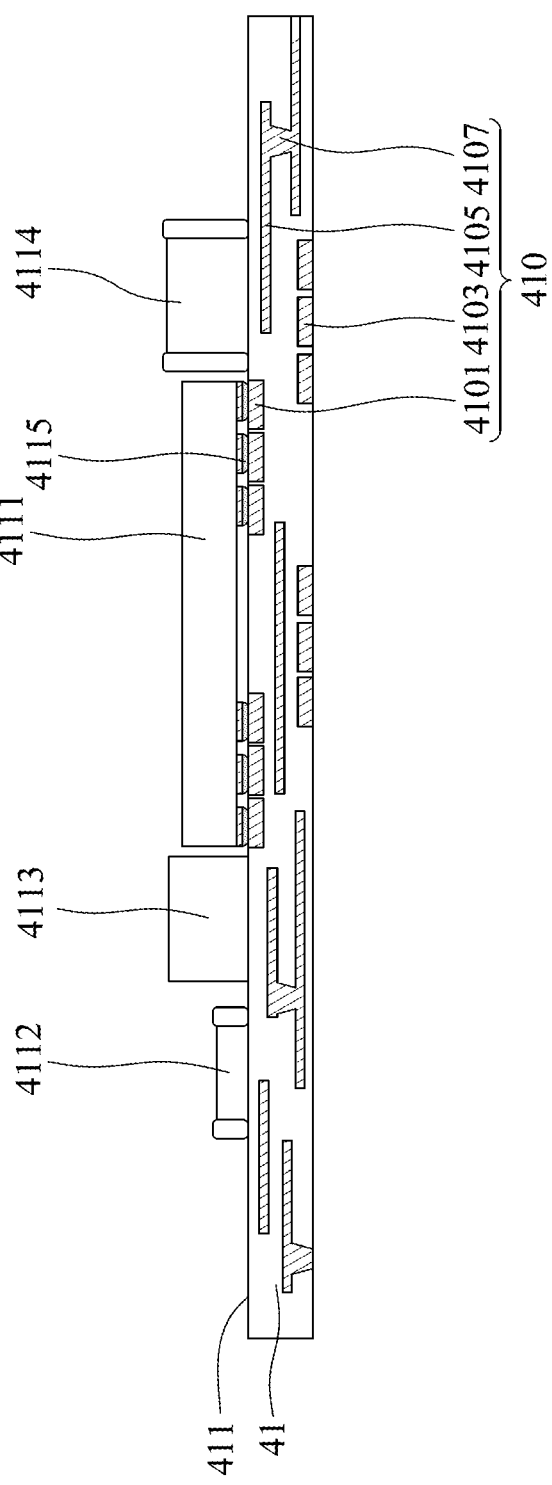

Referring to FIG. 4E, a circuit layer 41 and electronic components 4111, 4112, 4113 and 4114 are provided. The circuit layer 41 may have an interconnection 410, which may include one or more pads 4101, 4103, one or more redistribution layers 4105 and one or more through conductive vias 4107. The electronic components 4111, 4112, 4113 and 4114 are disposed on a surface 411 of the circuit layer 41. The electronic components 4111, 4112, 4113 and 4114 electrically connect the interconnection 410 of the circuit layer 41 via electrical connections. For example, the electronic component 4111 is electrically connected to the pads 4101 of the interconnection 410 of the circuit layer 41 via electrical connections 4115.

Figure 4F:
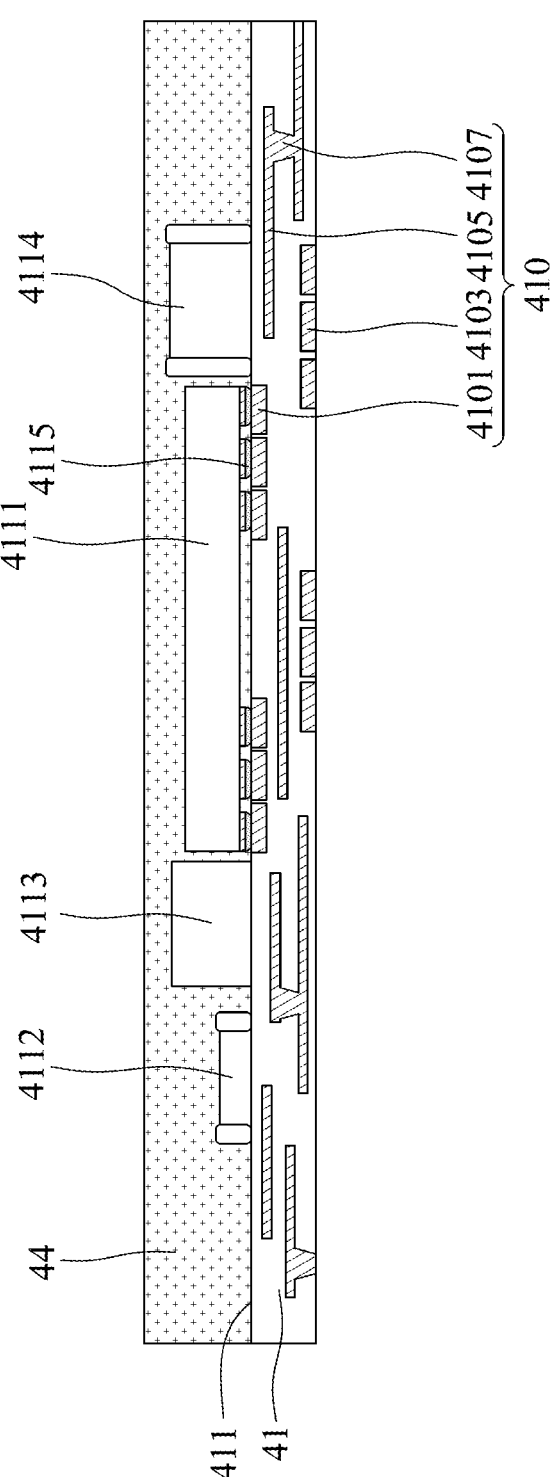

Referring to FIG. 4F, an encapsulant 44 is provided. The encapsulant 44 may be formed on the surface 411 of the circuit layer 41. The encapsulant 44 may cover the surface 411 of the circuit layer 41 and the electronic components 4111, 4112, 4113 and 4114.

Figure 4G:
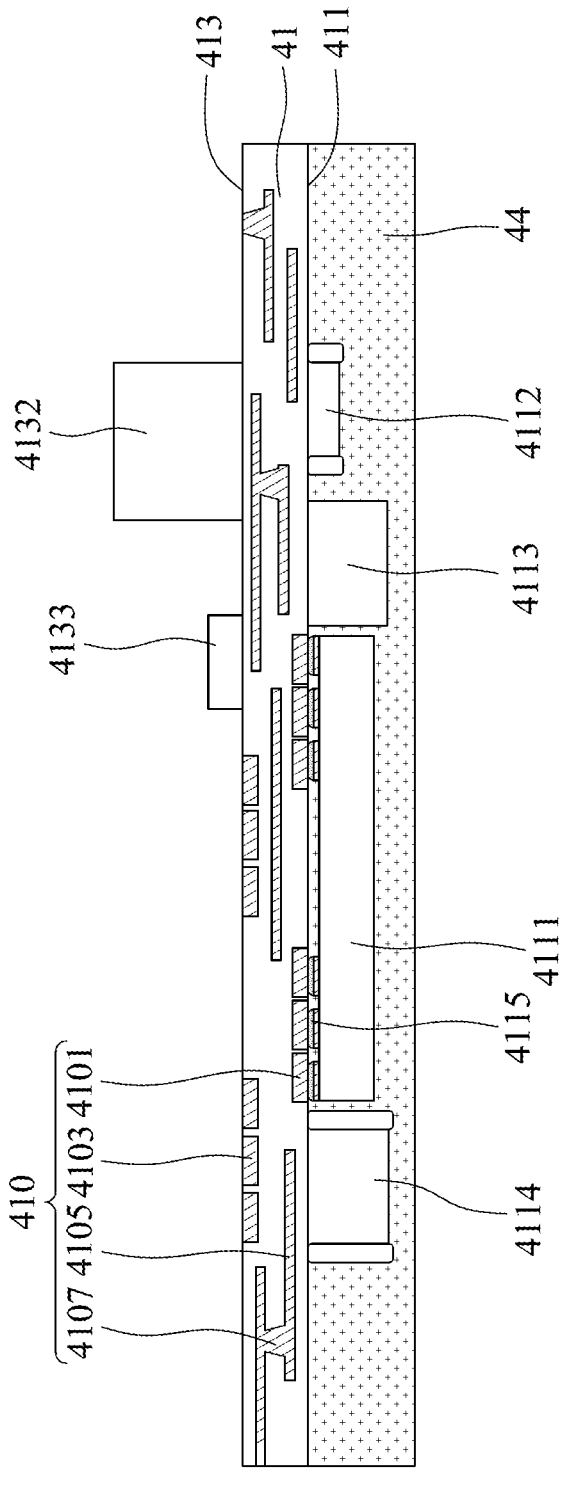

Referring to FIG. 4G, electronic components 4132 and 4133 are disposed or mounted on a surface 413 of the circuit layer 41. The electronic components 4132 and 4133 may electrically connect the interconnection 410 of the circuit layer 41 through electrical connections.

Figure 4H:
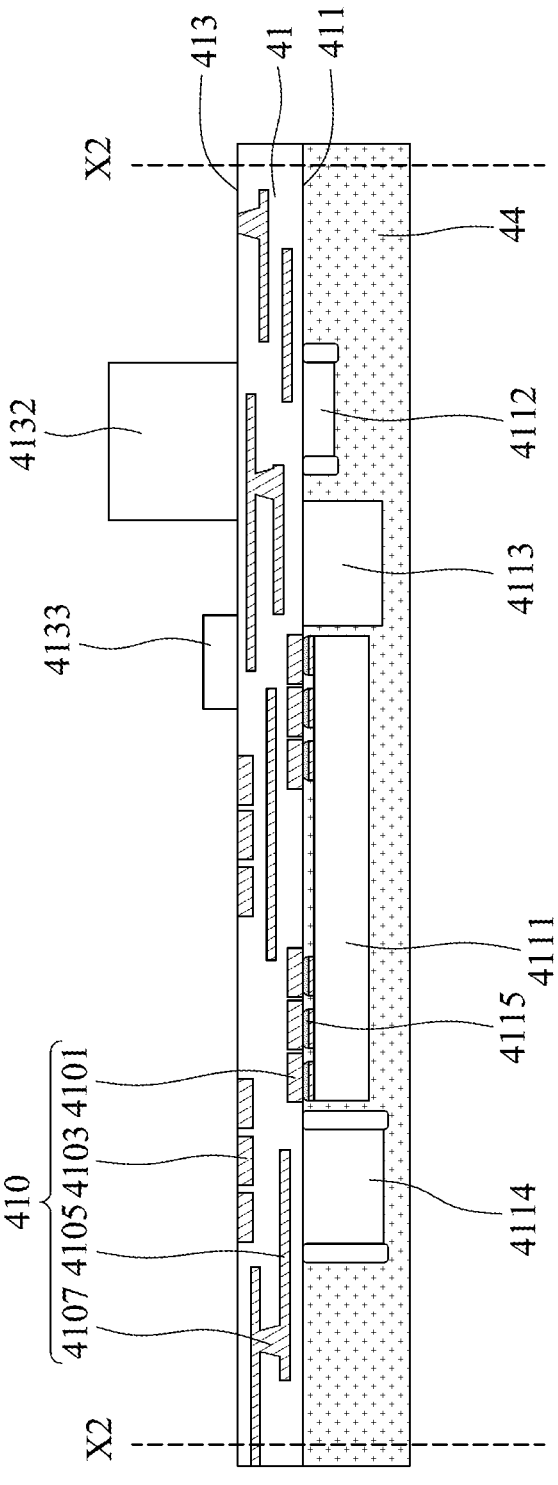

Referring to FIG. 4H, a singulation process is conducted to cut along the imaginary line "X2" through the encapsulant 44 and the circuit layer 41. Thus, an upper module is obtained.

Figure 4I:
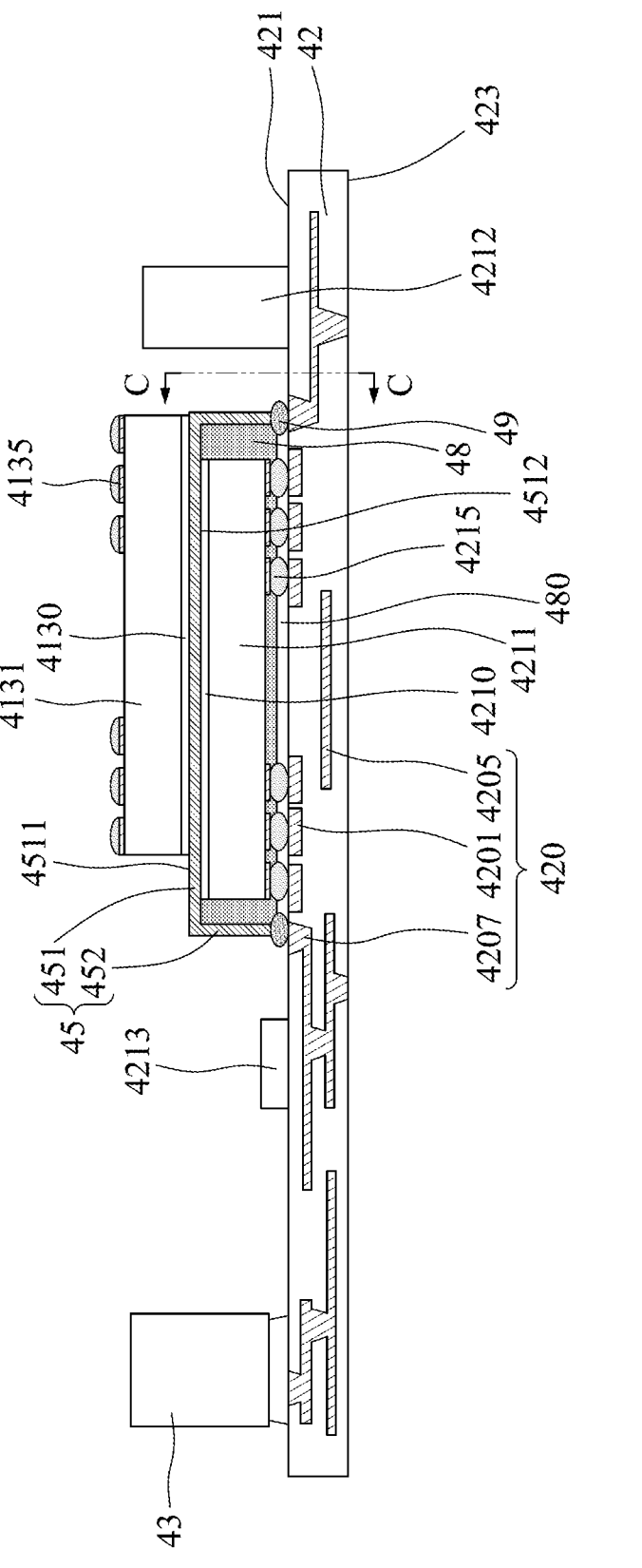

Referring to FIG. 4I, a circuit layer 42, an interposer 43 and electronic components 4212, 4213 are provided. The circuit layer 42 may have an interconnection 4210 which may include one or more pads 4201, one or more redistribution layers 4205 and one or more through conductive vias 4207. The interposer 43 and the electronic components 4212 and 4213 may be mounted and disposed on a surface 421 of the circuit layer 42 and electrically connected to the interconnection 4210 of the circuit layer 42. The structure obtained from FIG. 4D may be disposed or mounted on the surface 421 of the circuit layer 42. The conductive structure 45 may be electrically connected to the interconnection 410 of the circuit layer 41 through conductive elements 49. In addition, a reflow process may be performed, and thus the electrical connection 4211 may be disposed or mounted on the surface 421 of the circuit layer 42 and electrically connected to the interconnection 420 of the circuit layer 42 via the electrical connections 4215. Moreover, there is a gap 480 between the encapsulant 48 and the surface 421 of the circuit layer 42.

Figure 4J:
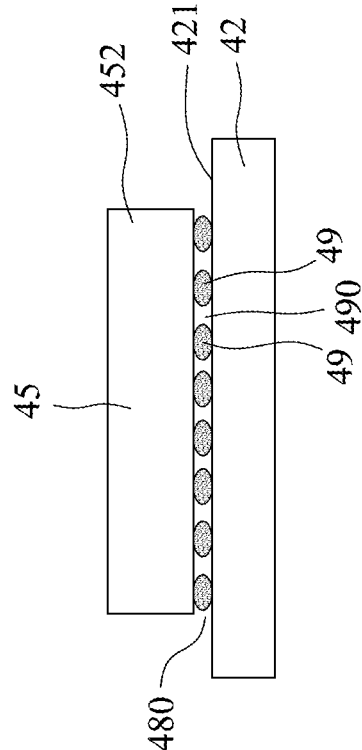

FIG. 4J is a side view along C-C illustrated in FIG. 4I. As shown in FIG. 4J, a plurality of conductive elements 49 are arranged between a bottom of the vertically extending section 452 of the conductive structure 45 and the surface 421 of the circuit layer, and thus the gap 480 is formed. Further, the conductive elements 49 are spaced apart from each other, and thus a space 490 is formed between the two adjacent conductive elements 49. The space 490 may be in fluid communication with the gap 480.

Figure 4K:
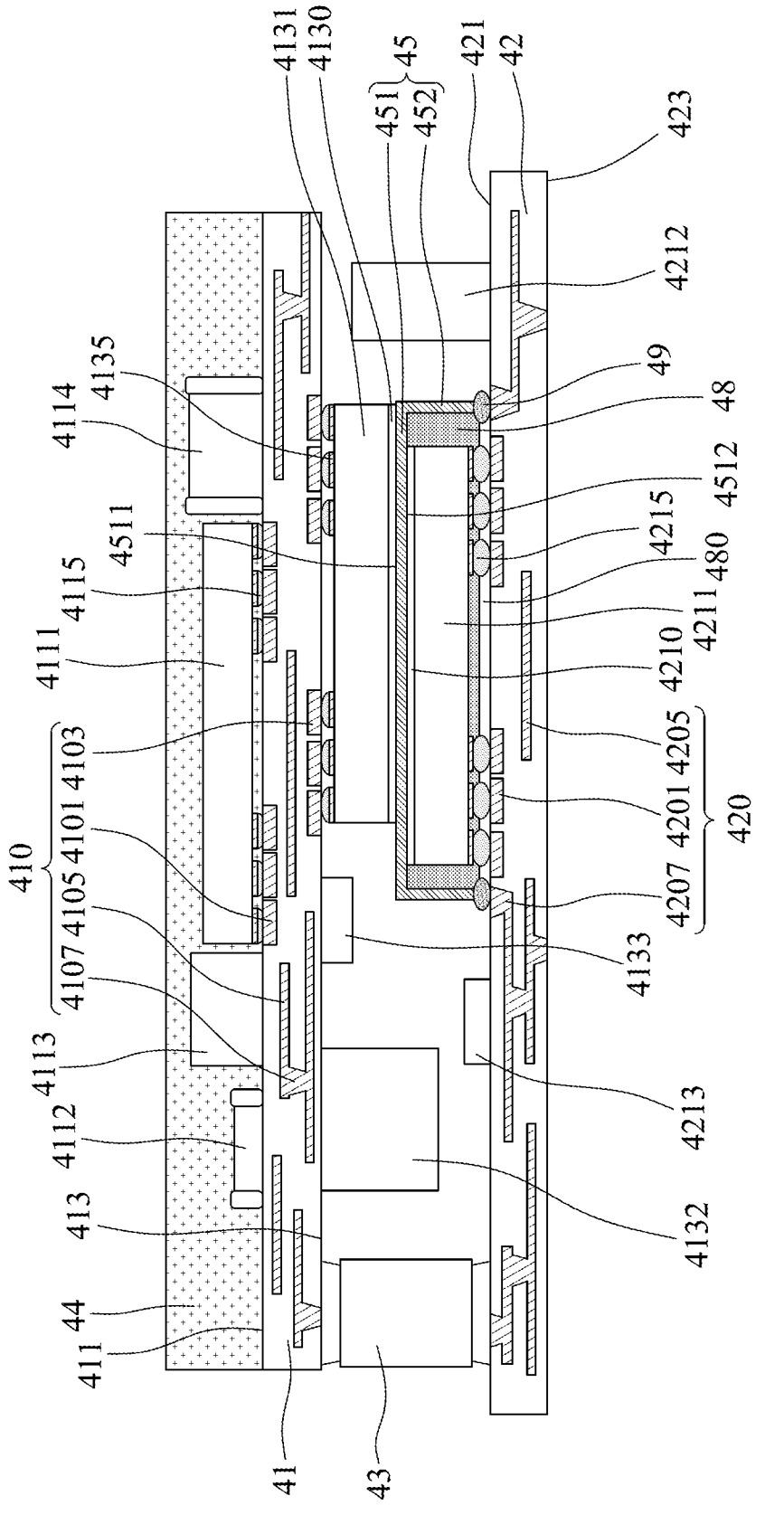

Referring to FIG. 4K, the upper module obtained from FIG. 4E may be reversed upside down and disposed on the structure obtained from FIG. 4I. The interposer 43 may support the surface 413 of the circuit layer 41 and electrically connect the interconnection 410 of the circuit layer 41 via electrical connections. The electronic component 4131 may be disposed or mounted on the surface 413 of the circuit layer and electrically connected to the interconnection 410 of the circuit layer 41 via electrical connections 4135.

Figure 4L:
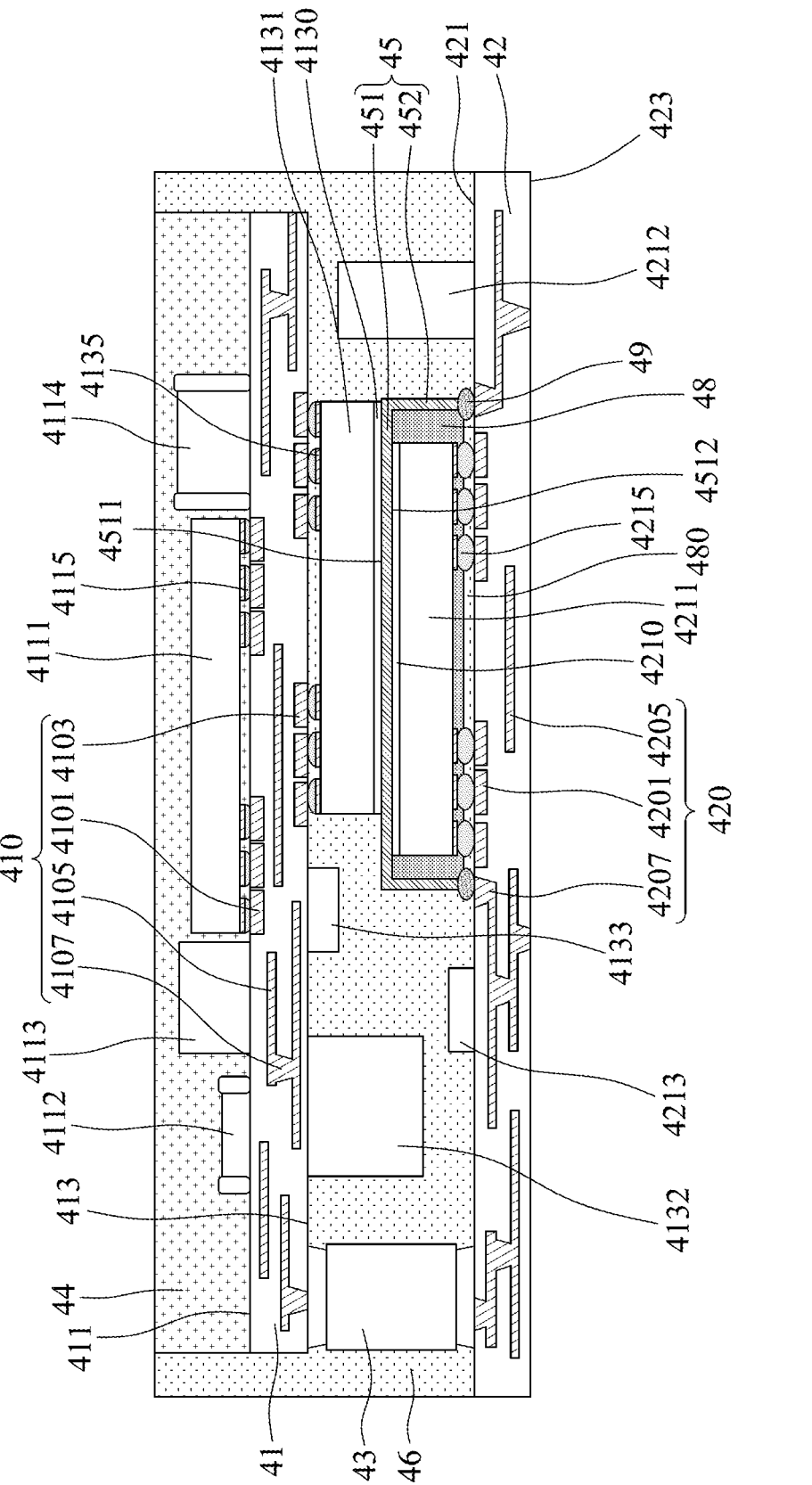

Referring to FIG. 4L, an encapsulant 46 is provided. The encapsulant 46 may be formed on the surface 421 of the circuit layer 42. The encapsulant 46 may cover the surface 421 of the circuit layer 42, the interposer 41, the electronic components 4212, 4213, the upper module and the sub-package. In addition, the encapsulant 46 may extend into the gap 480 between the encapsulant 48 and the surface 421 of the circuit layer 42 through the spaces 490 between the conductive elements 49.

Figure 4M:
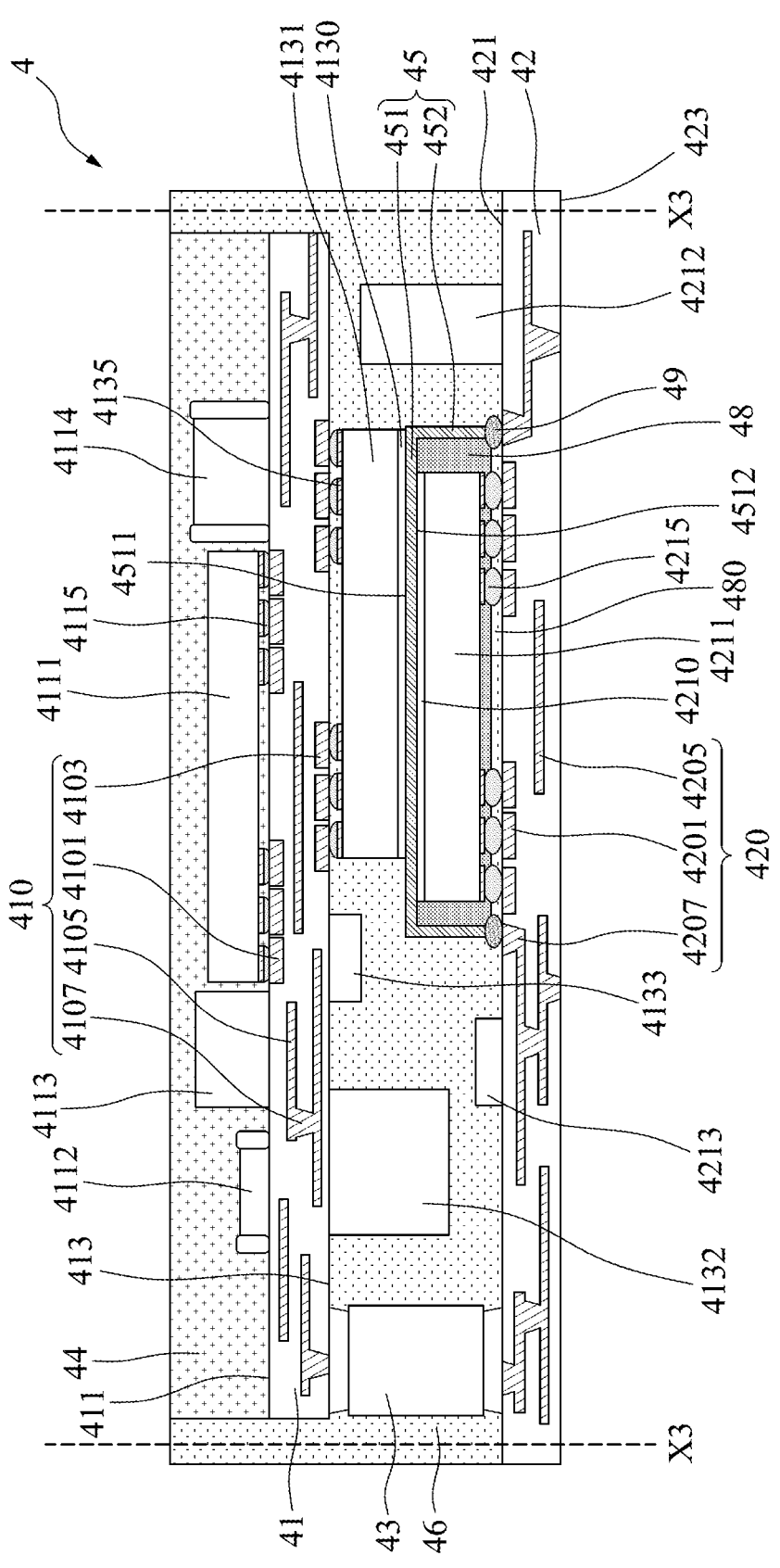

Referring to FIG. 4M, a singulation process is conducted to cut along the imaginary line "X3" through the circuit layer 42 and the encapsulant 46.

After the manufacturing process as shown in FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L and FIG. 4M, the semiconductor device package 4 is formed (see FIG. 4M). In some embodiments of the present disclosure, the semiconductor device package 4 is the same as, or similar to, the semiconductor device package 1 shown in FIG. 1A.

FIG. 5A, FIG. 5B, FIG. 5C, FIG. 5D, FIG. 5E, FIG. 5F, FIG. 5G, FIG. 5H, FIG. 5I, FIG. 5J, FIG. 5K and FIG. 5L illustrate a method of manufacturing a semiconductor device package 5 in accordance with another embodiment of the instant disclosure.

Figure 5A:
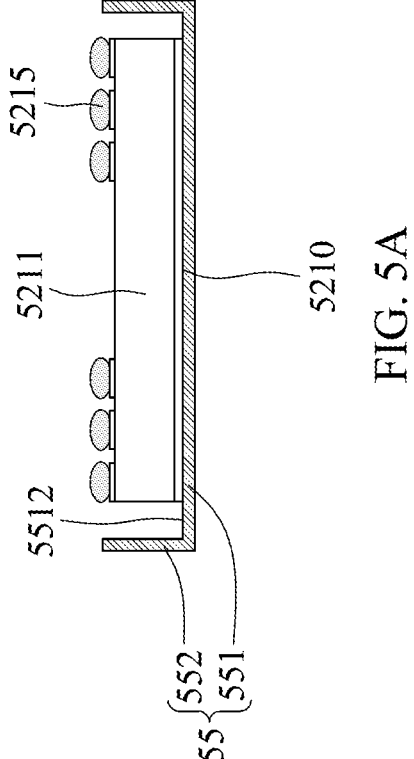
FIG. 5A, FIG. 5B, FIG. 5C, FIG. 5D, FIG. 5E, FIG. 5F, FIG. 5G, FIG. 5H, FIG. 5I, FIG. 5J, FIG. 5K and FIG. 5L illustrate a method of manufacturing a semiconductor device package in accordance with another embodiment of the instant disclosure.

Referring to FIG. 5A, a conductive structure 55 is provided and an electronic component 5211 is mounted to the conductive structure 55. As shown in FIG. 5A, the conductive structure 55 has a U-shaped cross-section and includes a laterally extending section 551 and at least two vertically extending sections 552. The electronic component 5211 is attached to a surface 5512 of the laterally extending section 551 of the conductive structure 55 via an adhesive layer 5210. In some embodiments of the present disclosure, the electrical connections 5215 are disposed on the electronic component 5211.

Figure 5B:
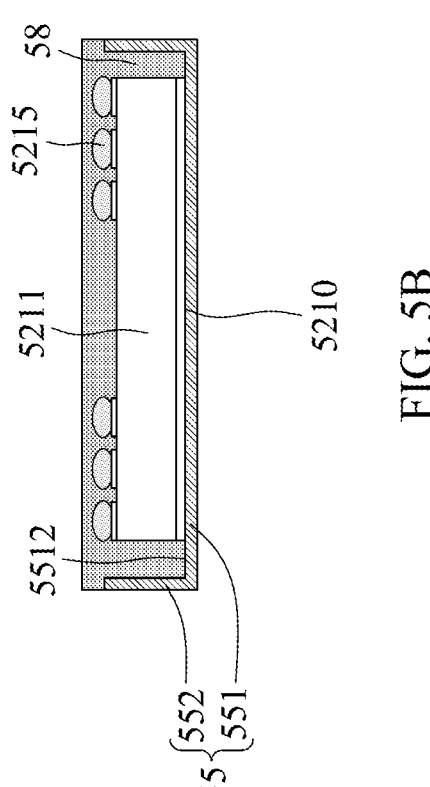

Referring to FIG. 5B, the encapsulant 58 is provided. The encapsulant 58 may be formed within the U-shaped conductive structure and cover the electronic component 5211, the electrical connections 5215 and the inner surface of the vertically extending section 552 and the surface 5512 of the laterally extending section 551 of the conductive structure 55.

Figures 5C, 5D:
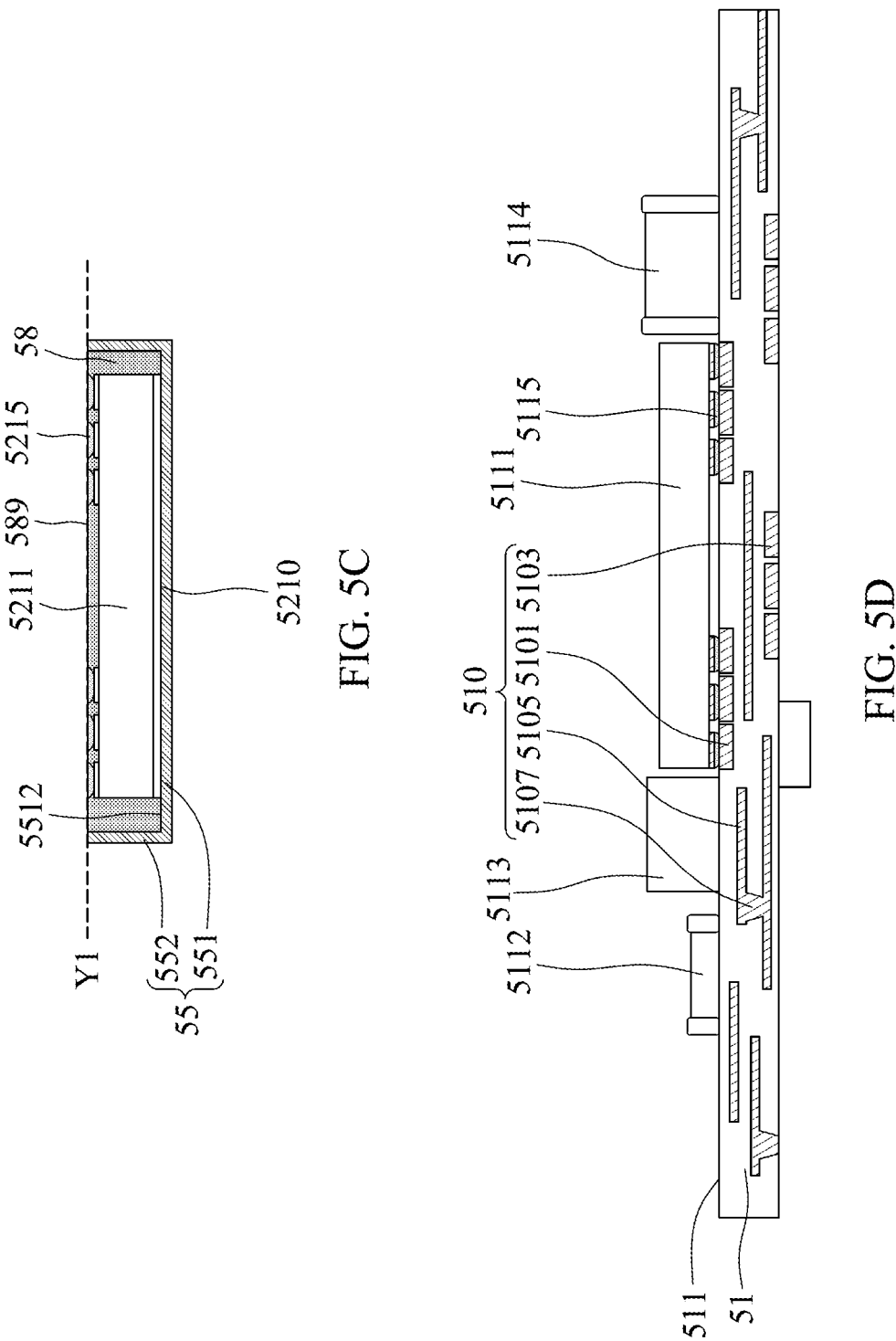

Referring to FIG. 5C, a grinding process is conducted to cut along the imaginary line "Y1" through the encapsulant 48 and the electrical connections 5215, such that an upper surface of the encapsulant 58 and/or top surfaces of the electrical connections 5215 may substantially align with a top end of the vertically extending section 552 of the conductive structure 55. Thus, a sub-package is obtained. Since the grinding process is conducted, the encapsulant 58 may include a truncated filler abutting the surface 589 of the encapsulant 58.

Referring to FIG. 5D, a circuit layer 51 and electronic components 5111, 5112, 5113 and 5114 are provided. The circuit layer 51 may have an interconnection 510, which may include one or more pads 5101, 5103, one or more redistribution layers 5105 and one or more through conductive vias 5107. The electronic components 5111, 5112, 5113 and 5114 are disposed on a surface 511 of the circuit layer 51. The electronic components 5111, 5112, 5113 and 5114 electrically connect the interconnection 510 of the circuit layer 51 via electrical connections. For example, the electronic component 5111 is electrically connected to the pads 5101 of the interconnection 510 of the circuit layer 51 via electrical connections 5115.

Figure 5E:
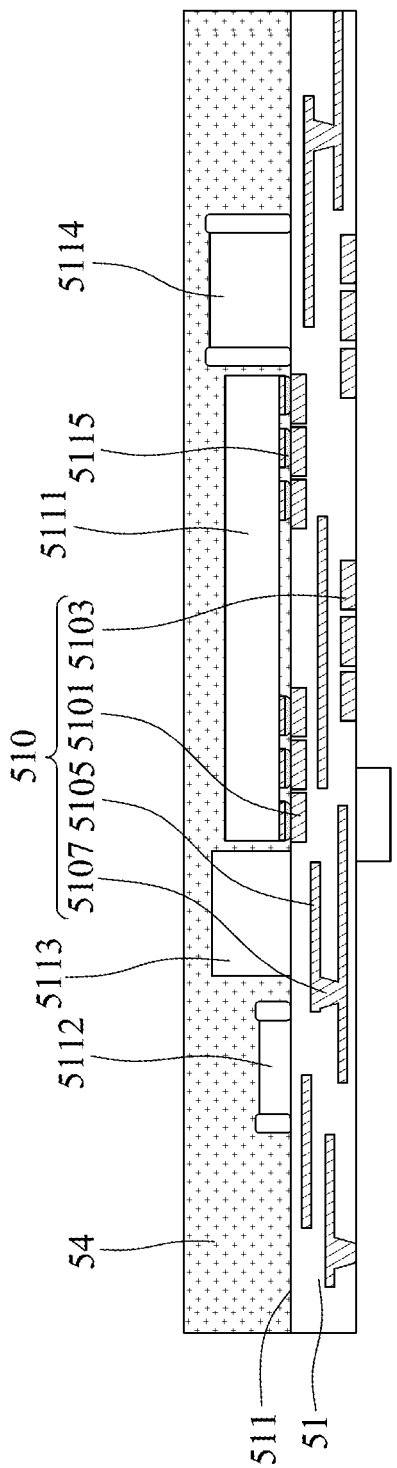

Referring to FIG. 5E, an encapsulant 54 is provided. The encapsulant 54 may be formed on the surface 511 of the circuit layer 51. The encapsulant 54 may cover the surface 511 of the circuit layer 51 and the electronic components 5111, 5112, 5113 and 5114.

Figure 5F:
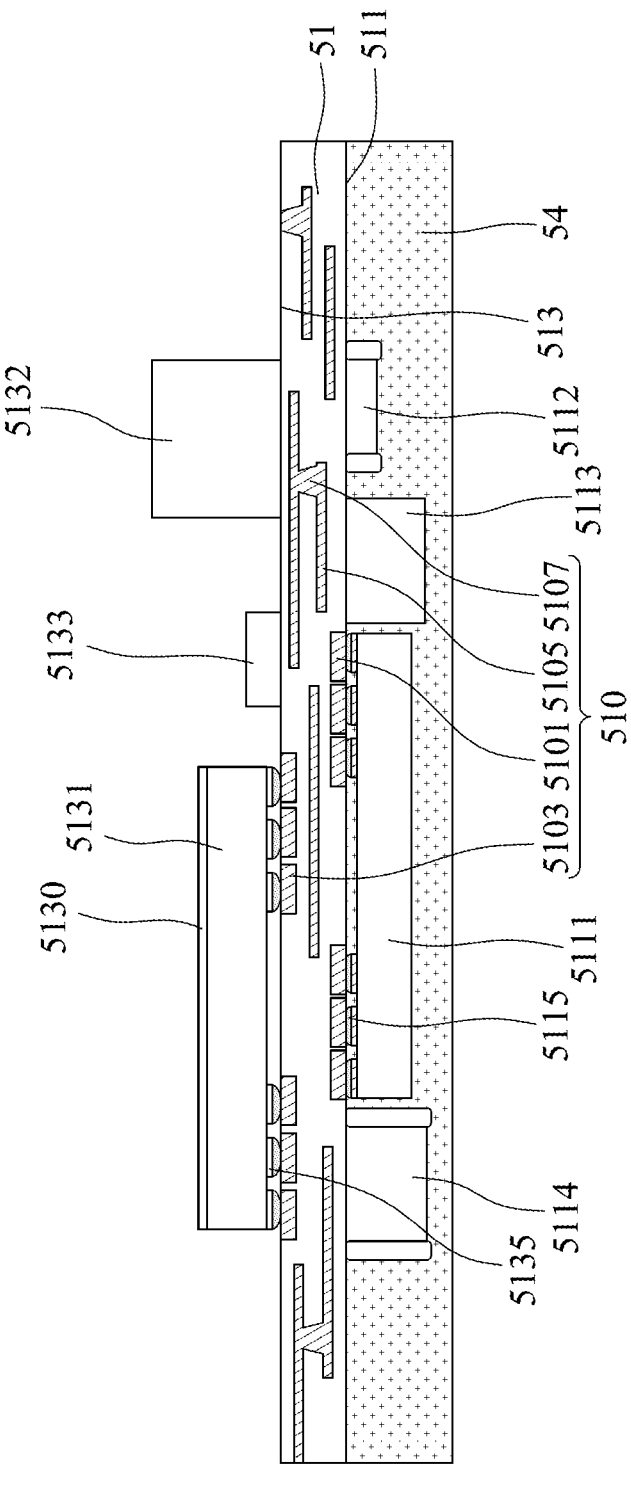

Referring to FIG. 5F, electronic components 5131, 5132 and 5133 are disposed or mounted on a surface 513 of the circuit layer 51. The electronic components 5131, 5132 and 5133 may electrically connect the interconnection 510 of the circuit layer 51 through electrical connections. For example, the electronic component 5131 is electrically connected to the pads 5103 of the interconnection 510 of the circuit layer 51 via electrical connections 5135.

Figure 5G:
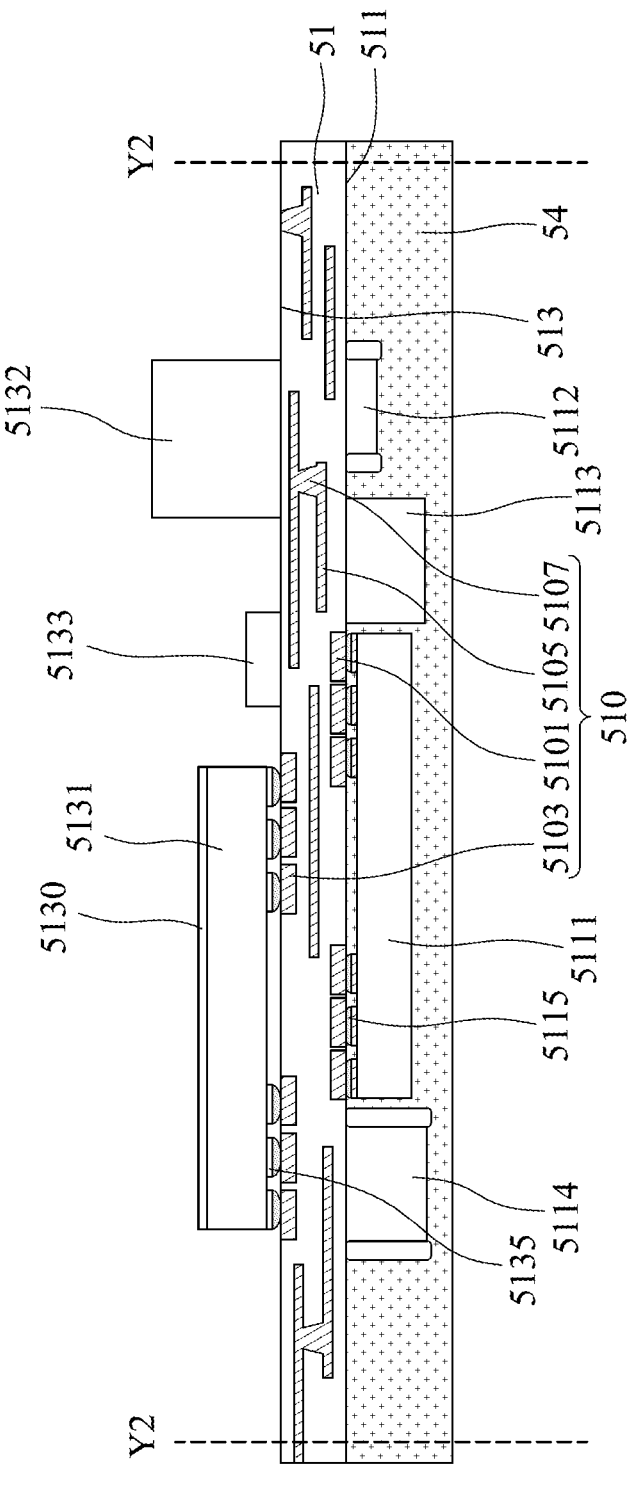

Referring to FIG. 5G, a singulation process is conducted to cut along the imaginary line "Y2" through the encapsulant 54 and the circuit layer 51. Thus, an upper module is obtained.

Figure 5H:
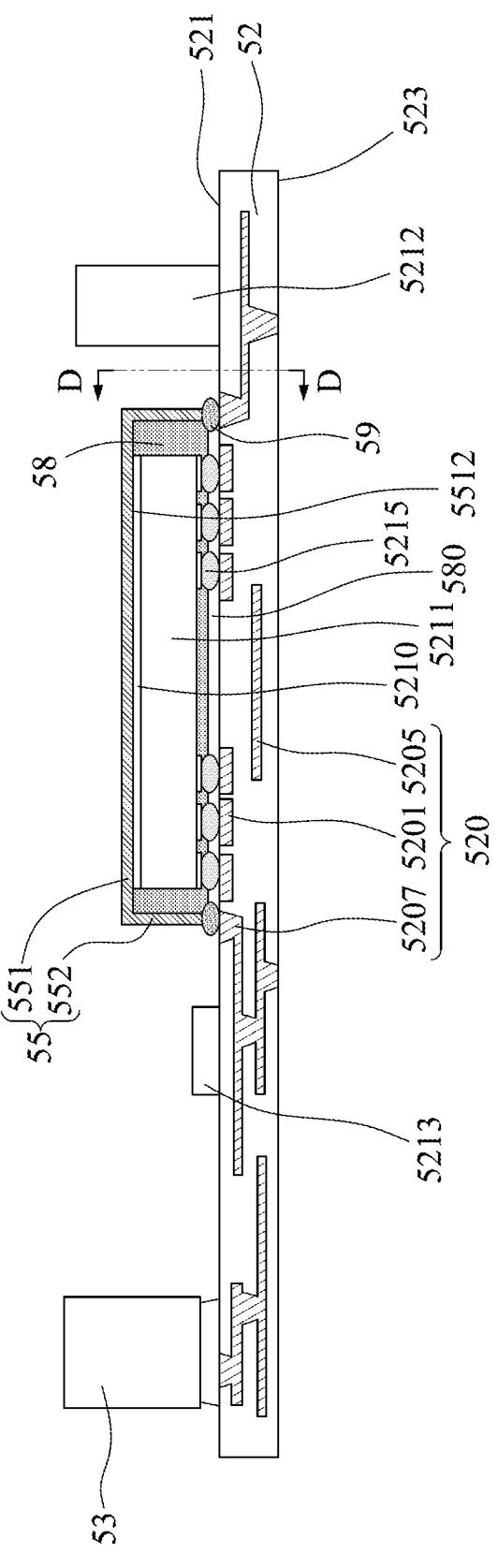

Referring to FIG. 5H, a circuit layer 52, an interposer 53 and electronic components 5212, 5213 are provided. The circuit layer 52 may have an interconnection 5210 which may include one or more pads 5201, one or more redistribution layers 5205 and one or more through conductive vias 5207. The interposer 53 and the electronic components 5212 and 5213 may be mounted and disposed on a surface 521 of the circuit layer 52 and electrically connected to the interconnection 5210 of the circuit layer 52. The sub-package obtained from FIG. 5C may be reversed upside down and disposed or mounted on the surface 521 of the circuit layer 52. The conductive structure 55 may be electrically connected to the interconnection 510 of the circuit layer 51 through conductive elements 59. In addition, a reflow process may be performed, and thus the electrical connection 5211 may be disposed or mounted on the surface 521 of the circuit layer 52 and electrically connected to the interconnection 520 of the circuit layer 52 via the electrical connections 5215. Moreover, there is a gap 580 between the encapsulant 58 and the surface 521 of the circuit layer 52.

Figure 5I:
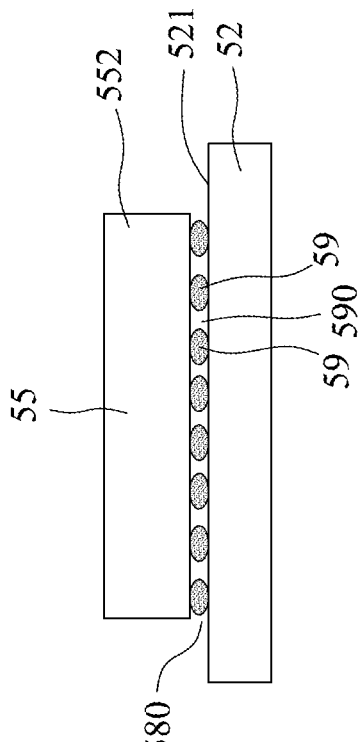

FIG. 5I is a side view along D-D illustrated in FIG. 5H. As shown in FIG. 5I, a plurality of conductive elements 59 are arranged between a bottom of the vertically extending section 552 of the conductive structure 55 and the surface 521 of the circuit layer, and thus the gap 580 is formed. Further, the conductive elements 59 are spaced apart from each other, and thus a space 590 is formed between the two adjacent conductive elements 59. The space 590 may be in fluid communication with the gap 580.

Figure 5J:
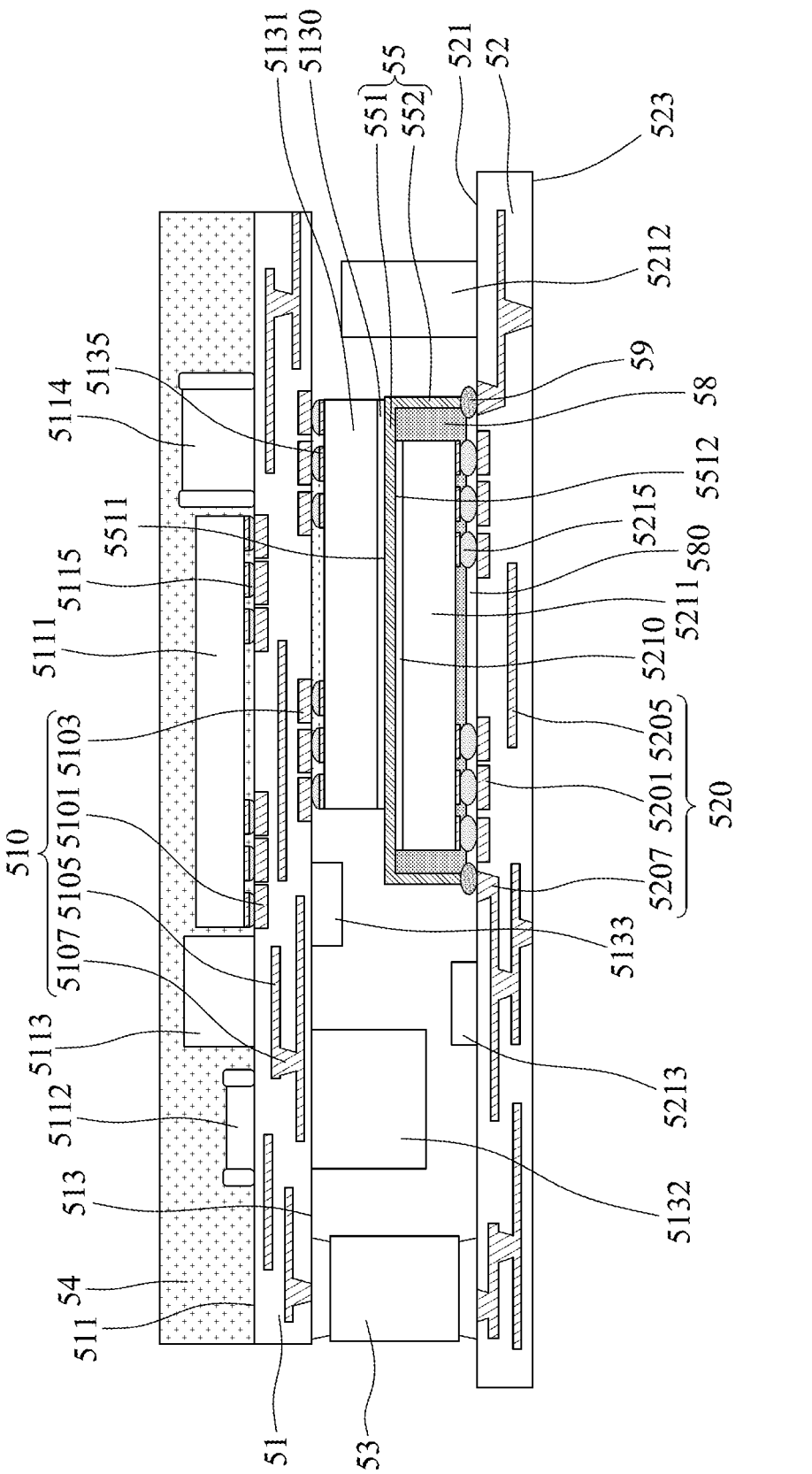

Referring to FIG. 5J, the upper module obtained from FIG. 5G may be reversed upside down and disposed on the structure obtained from FIG. 5H. The interposer 53 may support the surface 513 of the circuit layer 51 and electrically connect the interconnection 510 of the circuit layer 51 via electrical connections. The laterally extending section 551 of the conductive structure 55 may abut against the electronic component 5131.

Figure 5K:
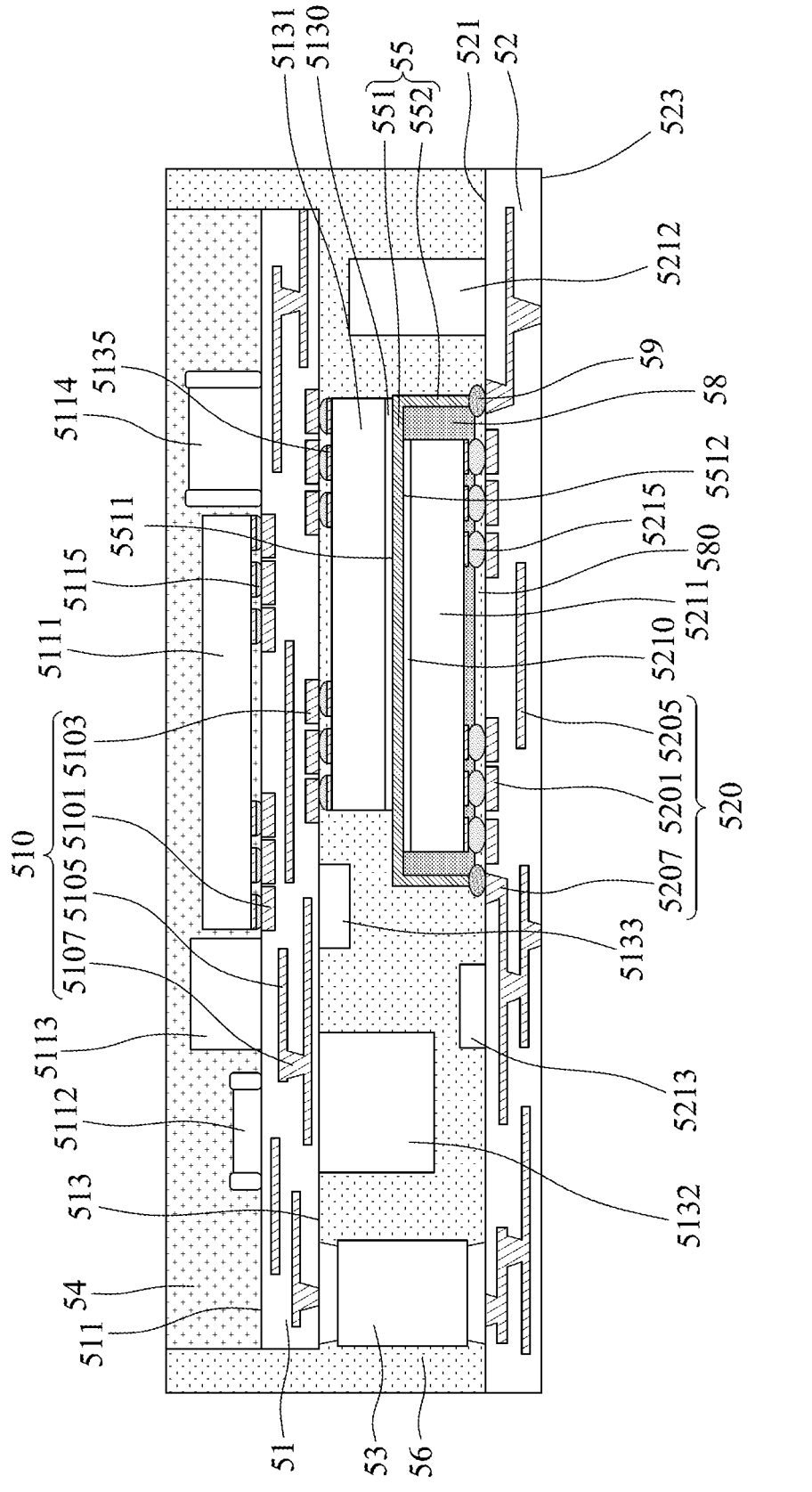

Referring to FIG. 5K, an encapsulant 56 is provided. The encapsulant 56 may be formed on the surface 521 of the circuit layer 52. The encapsulant 56 may cover the surface

521 of the circuit layer 52, the interposer 51, the electronic components 5212, 5213, the upper module and the sub-package. In addition, the encapsulant 56 may extend into the gap 580 between the encapsulant 58 and the surface 521 of the circuit layer 52 through the spaces 590 between the conductive elements 59.

Figure 5L:
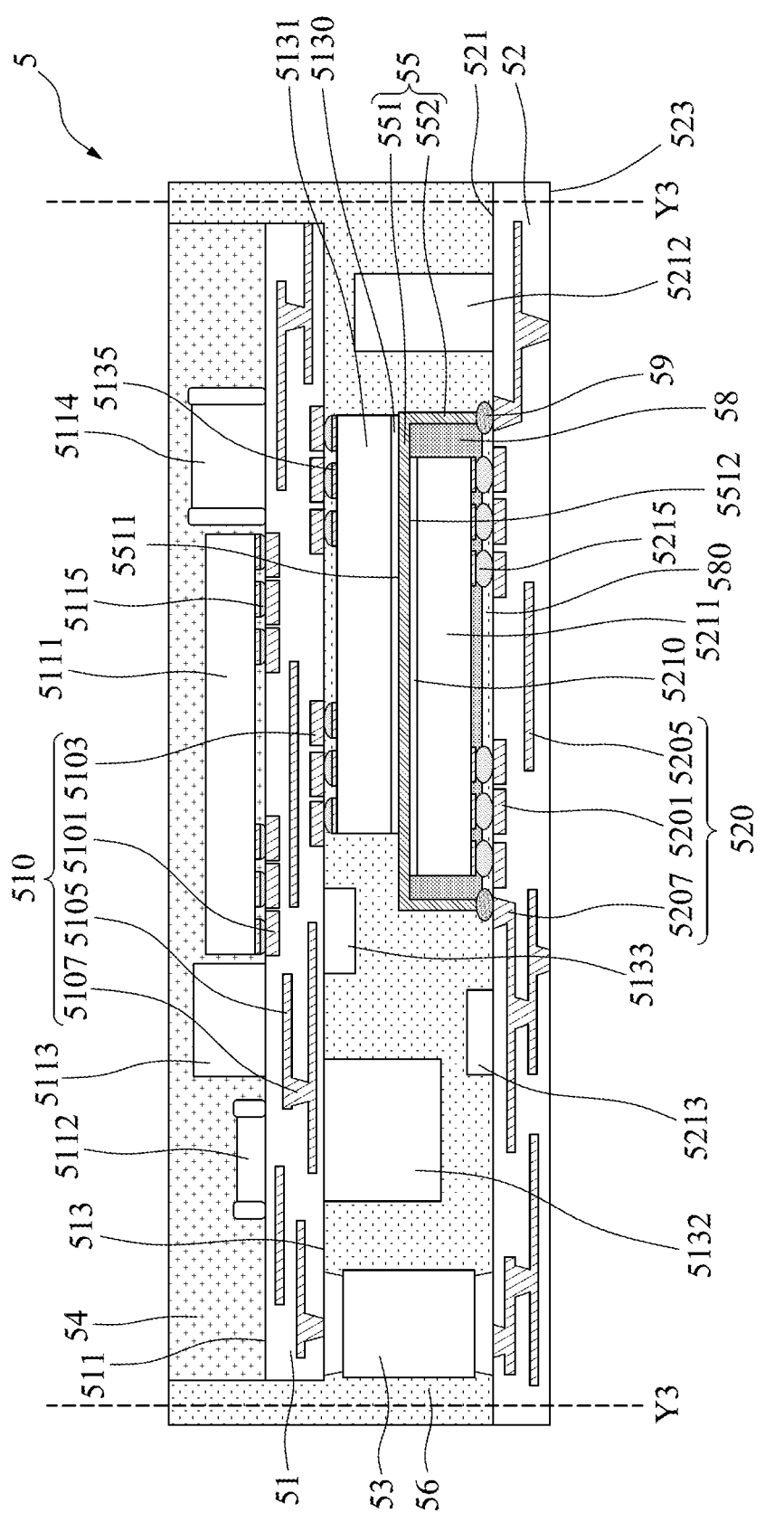

Referring to FIG. 5L, a singulation process is conducted to cut along the imaginary line "Y3" through the circuit layer 52 and the encapsulant 56.

After the manufacturing process as shown in FIG. 5A, FIG. 5B, FIG. 5C, FIG. 5D, FIG. 5E, FIG. 5F, FIG. 5G, FIG. 5H, FIG. 5I, FIG. 5J, FIG. 5K and FIG. 5L, the semiconductor device package 5 is formed (see FIG. 5L). In some embodiments of the present disclosure, the semiconductor device package 5 is the same as, or similar to, the semiconductor device package 1 shown in FIG. 1A.

Figure 6:
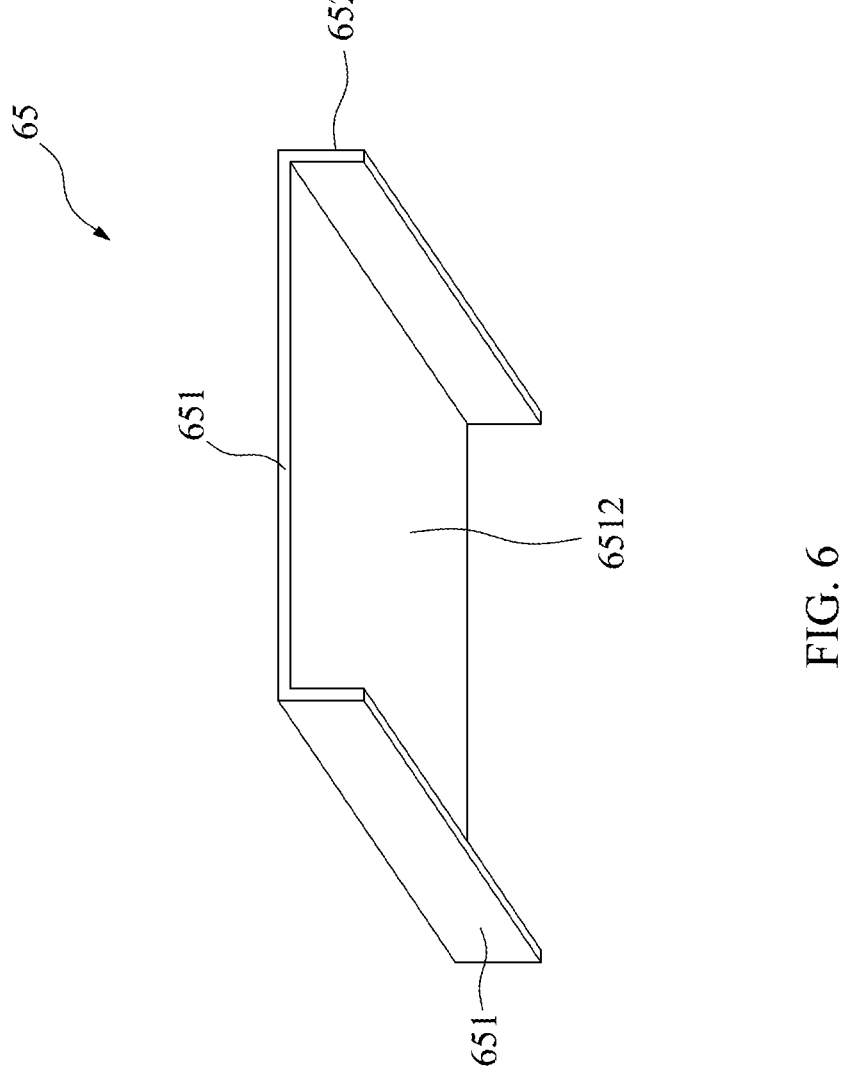
FIG. 6 is a perspective view of a conductive structure of a semiconductor device package in accordance with an embodiment of the instant disclosure.

FIG. 6 is a perspective view of a conductive structure 65 in accordance with an embodiment of the instant disclosure. In some embodiments of the present disclosure, the conductive structure 65 is the same as, or similar to, the conductive structure 15 shown in FIGS. 1A and 1B and the conductive structure 35 shown in FIG. 3. As shown in FIG. 6, the conductive structure 65 may have a laterally extending section 651 and two vertically extending sections 652 which are respectively connected to two opposite sides of the laterally extending section 651. The laterally extending section 651 may have a surface 6512 which may face a lower circuit layer when the conductive structure 65 is mounted on the lower circuit layer.

Figure 7:
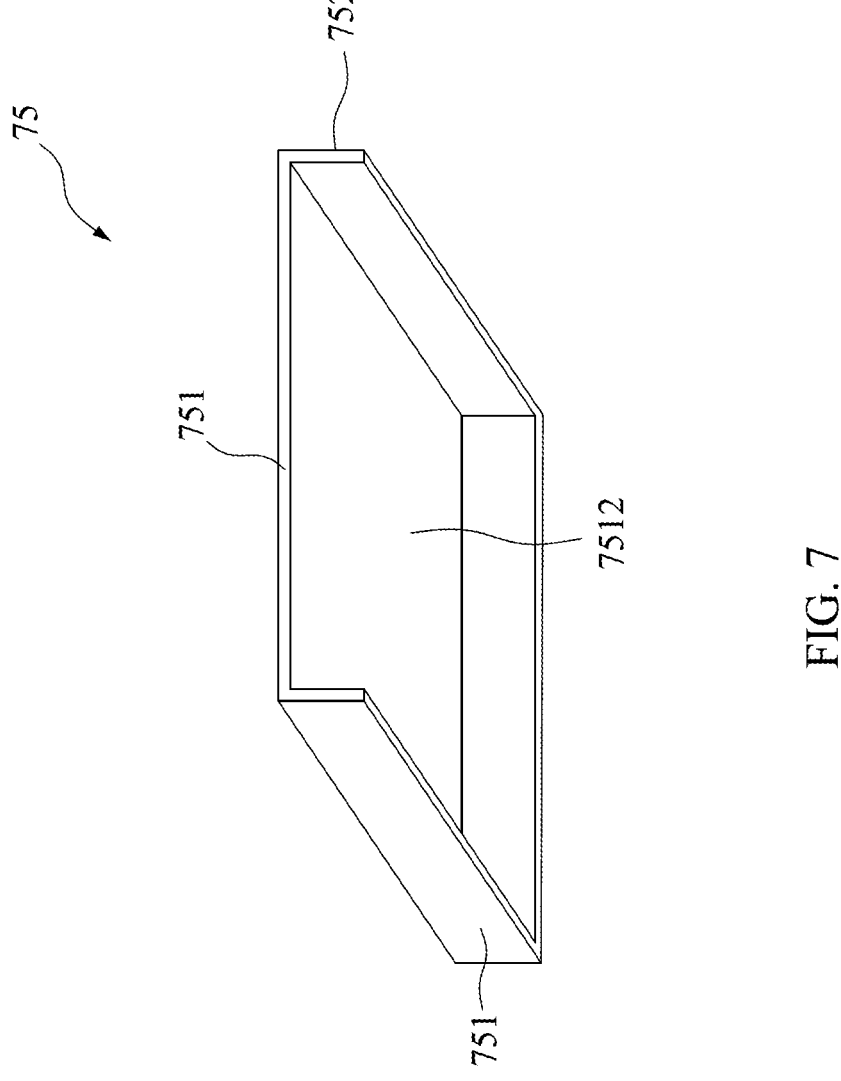
FIG. 7 is a perspective view of a conductive structure of a semiconductor device package in accordance with an embodiment of the instant disclosure.

FIG. 7 is a perspective view of a conductive structure 75 in accordance with an embodiment of the instant disclosure. In some embodiments of the present disclosure, the conductive structure 75 is the same as, or similar to, the conductive structure 15 shown in FIGS. 1A and 1B and the conductive structure 35 shown in FIG. 3. As shown in FIG. 7, the conductive structure 75 may have a laterally extending section 751 and three vertically extending sections 752 which are respectively connected to three sides of the laterally extending section 751. The laterally extending section 751 may have a surface 7512 which may face a lower circuit layer when the conductive structure 75 is mounted on the lower circuit layer.

Figure 8:
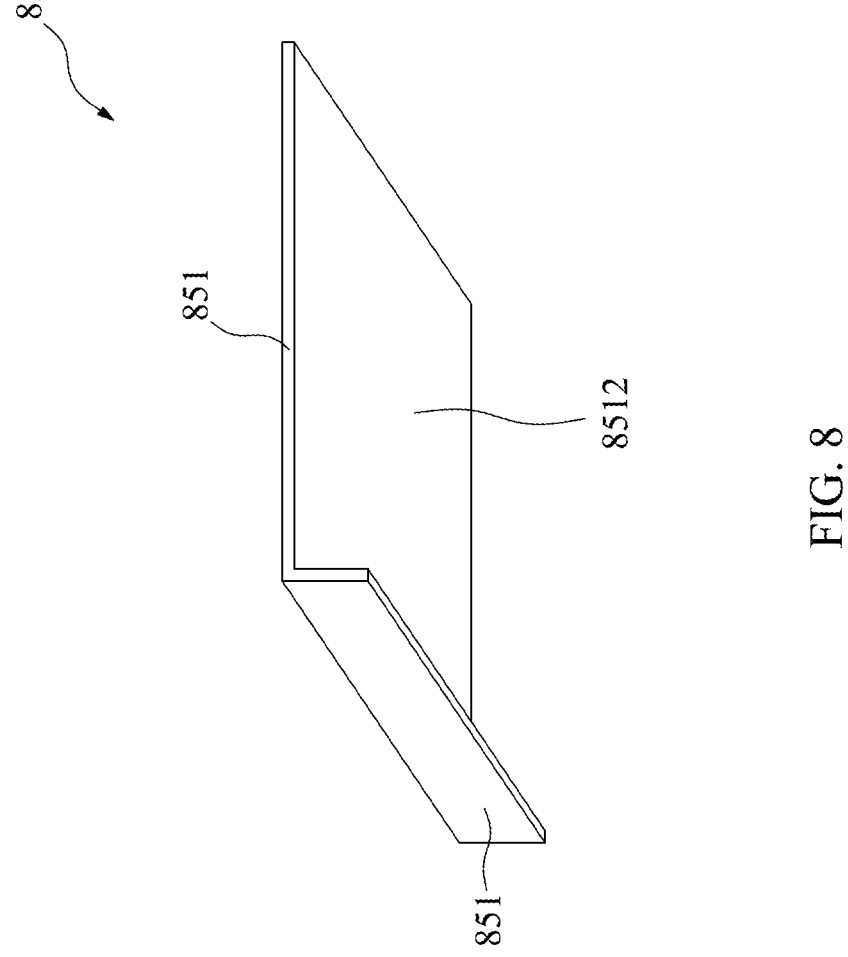
FIG. 8 is a perspective view of a conductive structure of a semiconductor device package in accordance with an embodiment of the instant disclosure.

FIG. 8 is a perspective view of a conductive structure 85 in accordance with an embodiment of the instant disclosure. In some embodiments of the present disclosure, the conductive structure 85 is the same as, or similar to, the conductive structure 25 shown in FIGS. 2A and 2B. As shown in FIG. 8, the conductive structure 85 may have a laterally extending section 851 and a vertically extending section 852 connected to a side of the laterally extending section 851. The laterally extending section 851 may have a surface 8512 which may face a lower circuit layer when the conductive structure 85 is mounted on the lower circuit layer.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to +5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. An electronic device, comprising:

a first circuit structure;

a first electronic component disposed under the first circuit structure;

a package structure disposed under the first circuit structure and comprising a second electronic component under the first electronic component and a conductive structure configured to dissipate heat generated from the first electronic component, wherein the package structure comprises a first encapsulant covering the second electronic component; and

a second encapsulant covering the first electronic component and the package structure.

2. The electronic device of claim 1, further comprising:

a third component disposed under the first circuit structure and separated from the second electronic component by the conductive structure.

3. The electronic device of claim 2, wherein the conductive structure is configured to provide electromagnetic shielding function between the second electronic component and the third electronic component.

4. The electronic device of claim 1, further comprising:

a second circuit structure disposed under the package structure; and an interposer supporting the first circuit structure, wherein the interposer is configured to provide a signal transmission path between the first circuit structure and the second circuit structure.

5. The electronic device of claim 4, wherein the package structure supports the first electronic component and is configured to provide a non-signal transmission path between the first electronic component and the second circuit structure.

6. The electronic device of claim 1, wherein the conductive structure is configured to provide electromagnetic shielding function between the first electronic component and the second electronic component.

7. The electronic device of claim 1, wherein a portion of the second encapsulant is disposed under the package structure.

8. The electronic device of claim 4, wherein the conductive structure and the second circuit structure are configured to provide a first heat dissipation path for dissipating the heat from the first electronic component, and wherein the conductive structure, the second electronic component and the second circuit structure are configured to provide a second heat dissipation path for dissipating the heat from the first electronic component, and wherein a heat dissipation efficiency of the first heat dissipation path is higher than a heat dissipation efficiency of the second heat dissipation path.

9. The electronic device of claim 4, wherein the conductive structure is connected to the second circuit structure through a first conductive element to form a non-signal transmission path, and wherein the second electronic component is connected to the second circuit structure through a second conductive element to form a signal transmission path.

* * * * *